United States Patent [19]
Marshall et al.

[11] Patent Number: 5,811,815
[45] Date of Patent: Sep. 22, 1998

[54] DUAL-BAND MULTI-LEVEL MICROBRIDGE DETECTOR

[75] Inventors: Charles M. Marshall, North Andover; Richard Blackwell, Andover, both of Mass.

[73] Assignee: Lockheed-Martin IR Imaging Systems, Inc.

[21] Appl. No.: 751,516

[22] Filed: Nov. 15, 1996

Related U.S. Application Data

[60] Provisional application No. 60/006,790 Nov. 15, 1995.
[51] Int. Cl.$^6$ .............................. H01L 27/14; H01L 31/09
[52] U.S. Cl. .................................... 250/370.06; 250/338.4
[58] Field of Search ............................ 250/370.06, 338.4, 250/332, 370.08

[56] References Cited

U.S. PATENT DOCUMENTS

| | | | |
|---|---|---|---|
| 3,962,578 | 6/1976 | Roschen | 250/370.06 |
| 4,651,001 | 3/1987 | Harada et al. | 250/332 X |
| 4,679,068 | 7/1987 | Lillquist et al. . | |
| 4,751,571 | 6/1988 | Lillquist . | |
| 4,754,139 | 6/1988 | Ennulat et al. . | |
| 4,922,116 | 5/1990 | Grinberg et al. . | |
| 4,956,686 | 9/1990 | Borrello et al. . | |
| 5,010,251 | 4/1991 | Grinberg et al. . | |
| 5,021,663 | 6/1991 | Hornbeck | 250/338.4 X |
| 5,113,076 | 5/1992 | Schulte . | |
| 5,171,733 | 12/1992 | Hu . | |
| 5,286,976 | 2/1994 | Cole . | |
| 5,288,649 | 2/1994 | Keenan . | |
| 5,300,777 | 4/1994 | Goodwin . | |
| 5,300,915 | 4/1994 | Higashi et al. . | |

(List continued on next page.)

FOREIGN PATENT DOCUMENTS

| | | |
|---|---|---|
| 0384880A2 | 8/1990 | European Pat. Off. . |
| 0475525A1 | 9/1991 | European Pat. Off. . |
| A-0 475 525 | 3/1992 | European Pat. Off. . |
| 0481552A1 | 4/1992 | European Pat. Off. . |
| 61-024272 | 2/1986 | Japan . |
| WO93/09414 | 5/1993 | WIPO . |
| WO93/26050 | 12/1993 | WIPO . |
| WO94/10743 | 1/1994 | WIPO . |

OTHER PUBLICATIONS

N. Butler, R. Blackwell, R. Murphy, R. Silva and C. Marshall "Dual Use, Low Cost Uncooled Micro–bolometer Imaging System", Presented at SPIE, San Diego, CA Jul. 12, 1995.

Neal Butler, Richard Blackwell, Dan Abate, Charles Marshall and Walt Watson "Advanced Microbolometer Digital Output Focal Plane Array", Lockheed Martin IR Imaging Systems, Jul. 1996.

International Search Report from International Application PCT/US96/18630, filed Nov. 15, 1996.

*Primary Examiner*—Edward J. Glick
*Attorney, Agent, or Firm*—Wolf, Greenfield & Sacks, P.C.

[57] ABSTRACT

A dual-band detector that absorbs incident radiation in a first range of wavelengths and that absorbs incident radiation in a second range of wavelengths. The dual-band detector includes a semiconductor substrate and a first microbridge detector level disposed above the semiconductor substrate. The first microbridge detector level includes an active area that absorbs incident radiation in one of the first range of wavelengths and the second range of wavelengths. In one embodiment, the semiconductor substrate includes a detector that detects incident radiation in the other of the first and second range of wavelengths. In another embodiment, the dual-band microbridge detector also includes a second microbridge detector level. The second microbridge detector level also includes an active area that absorbs incident radiation in an alternative one of the first range of wavelengths and the second range or wavelengths. With this apparatus, the dual-band detector can operate in a first range of wavelengths and also in a second range of wavelengths. In addition, this apparatus can be fabricated using existing processing techniques.

31 Claims, 18 Drawing Sheets

U.S. PATENT DOCUMENTS

| | | | |
|---|---|---|---|
| 5,367,167 | 11/1994 | Keenan | 250/338.4 |
| 5,369,280 | 11/1994 | Liddiard . | |
| 5,373,182 | 12/1994 | Norton . | |
| 5,399,897 | 3/1995 | Cunningham et al. . | |
| 5,444,236 | 8/1995 | Ludington et al. . | |
| 5,446,284 | 8/1995 | Butler et al. . | |
| 5,486,698 | 1/1996 | Hanson et al. . | |
| 5,512,748 | 4/1996 | Hanson . | |
| 5,534,111 | 7/1996 | Hocker et al. . | |
| 5,602,385 | 2/1997 | Mathieu et al. . | |
| 5,647,946 | 7/1997 | Belcher et al. . | |
| 5,654,580 | 8/1997 | Beratan et al. . | |
| 5,656,848 | 8/1997 | Beratan et al. . | |
| 5,672,903 | 8/1997 | Butler et al. . | |

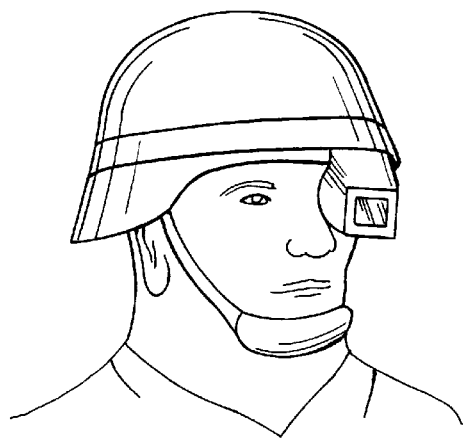
FIG. 12a
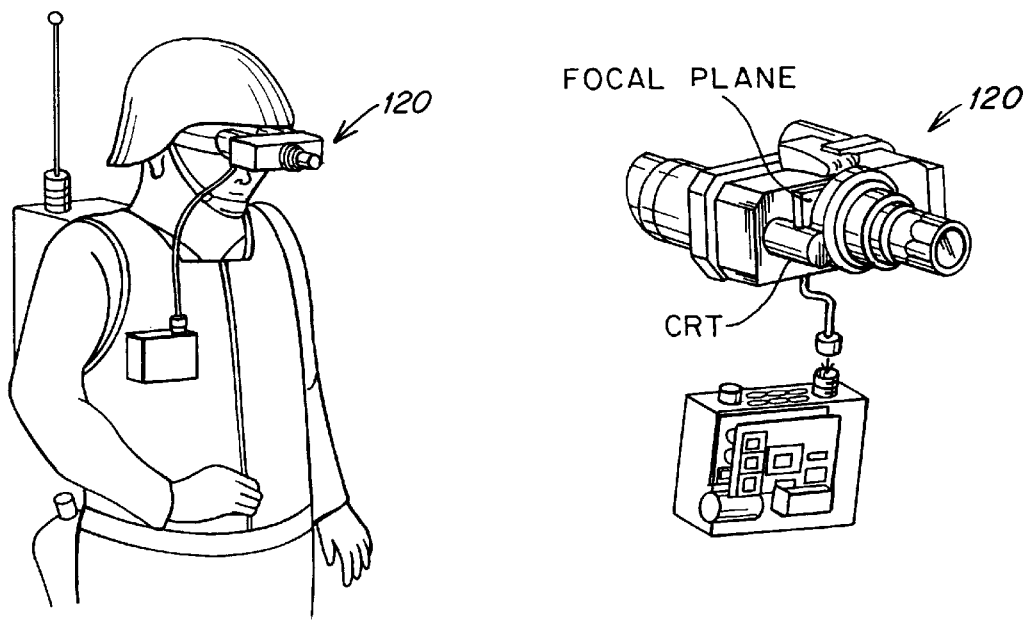
FIG. 12b
FIG. 12c

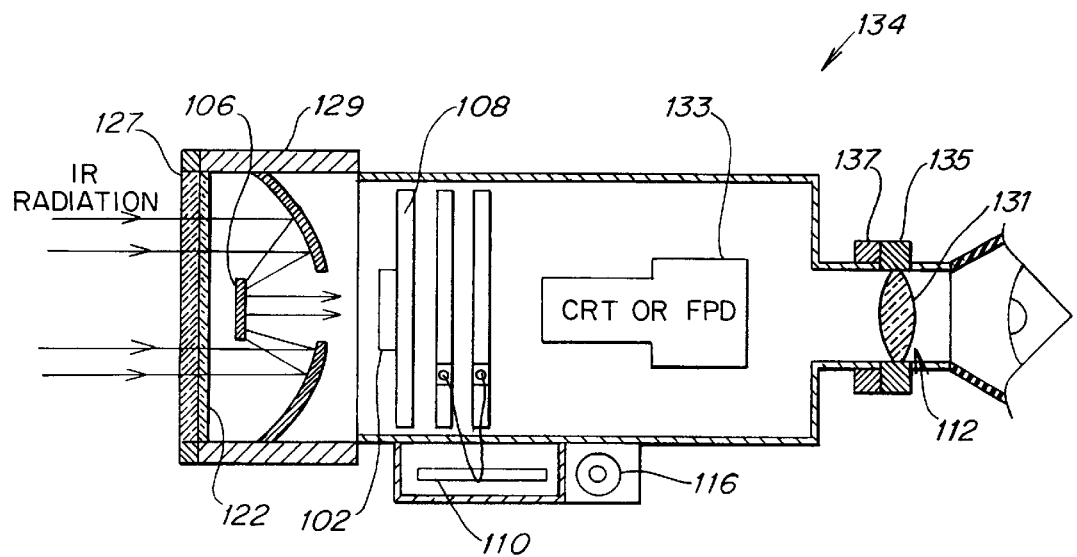
FIG. 14a
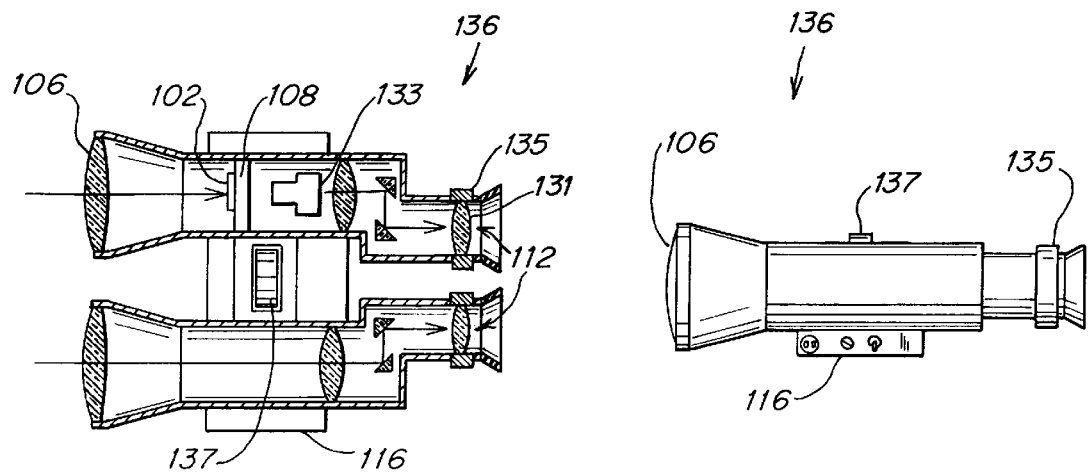
FIG. 14b
FIG. 14c

DUAL-BAND MULTI-LEVEL MICROBRIDGE DETECTOR

This application claims the benefit of prior filed Provisional Application No. 60/006,790, filed Nov. 15, 1995 and entitled Dual Band Focal Plane and Associated Methods.

BACKGROUND OF THE INVENTION

1. Field of the Invention

The field of the present invention is directed to uncooled thermal microdetectors, and in particular, the present invention relates to thermal detector devices that detect radiation in two or more wavelength bands of the electromagnetic spectrum.

2. Discussion of the Related Art

In the field of infrared (IR) detectors, it is known to provide a two-level bolometer radiation detector having a microbridge on a second plane disposed above a first plane including a silicon substrate. For example, U.S. Pat. Nos. 5,286,976 (hereinafter "the '976 patent") and 5,300,915 (hereinafter "the '915 patent") disclose a two-level, infrared bolometer detector device 10 as illustrated in FIG. 1. A bolometer is an electromagnetic radiation detector that operates by absorbing incident electromagnetic energy and converting the absorbed incident electromagnetic energy into heat. The bolometer detector device as disclosed in the '915 and '976 patents has an elevated microbridge detector level 11 and a lower level 12. The lower level 12 includes a semiconductor substrate 13 having fabricated at a top surface 14 components of an integrated circuit (IC) 15, using conventional silicon IC fabrication technology. The components of the IC are coated with a protective layer of silicon nitride 16 which protects the IC from contamination. The elevated microbridge detector level 11 includes a silicon nitride layer 20, a resistive layer 21, a silicon nitride layer 22 disposed over the silicon nitride layer 20 and the resistive layer 21, and an IR absorbing layer 23 disposed over the silicon nitride layer 22. Downwardly extending silicon nitride layers 20' and 22', deposited during the fabrication process, provide sloping support legs for the elevated microbridge detector level 11.

The '915 and '976 patents also disclose that a thin film layer 18 of reflective material can be deposited on the lower level 12, to provide a cavity 26 between the elevated microbridge detector level 11 and the lower level 12. A vertical distance d, between the reflective layer 18 and the upper microbridge detector level 11, is chosen so that incident energy passing through layers 20, 21, 22 and 23 is reflected by layer 18 upwardly and has constructive interference properties with the IR energy initially incident on the upper microbridge detector level 11. In particular the '915 and '976 patents disclose that the distance d is chosen to be substantially a quarter of a wavelength of a wavelength band of operation of the detector device, so that a phase of the reflected energy is coincident with a phase of the incident IR energy on the upper microbridge detector level. The '915 and '976 patents further disclose that the elevated microbridge detector level 11 includes a detector of the incident IR energy wherein the IR absorbing layer 23 and the resistive layer 21 make up an active area (not illustrated) of the detector.

As is known in the art, a sensitivity of the bolometer detector device 10 of FIG. 1 is a function of many factors including an absorption coefficient of each material making up the active area of the device over the desired wavelength band of operation, a physical structure of the detector including the cavity structure 26, a thermal isolation of the active area provided by the microbridge structure, and the like. In FIG. 1, the cavity 26 and the microbridge structure provide isolation of the detector's active area from its surroundings, for example the integrated circuit 15, so as to obtain higher isolation than if the active area were disposed on the top surface 14 of the semiconductor substrate 13. The microbridge structure of FIG. 1 also provides for a larger fill factor than a single level bolometer detector device disposed within the substrate 13, since the detector is disposed on the elevated microbridge detector level and the bus lines, the components of the integrated circuit, and the like are disposed on the lower level 12. It is to be understood that for this specification, the fill factor is defined as a fraction of a pixel area that is the active area of the detector. It is also to be understood that the pixel area is the area containing the bolometer detector device 10, or in other words the area within a plane of the substrate 13 that includes either one or both of the upper microbridge detector level 11 and the IC circuit on the lower level 12. In other words the pixel fill factor is the active area divided by the pixel area. Further it is to be understood that the pixel collecting area of the bolometer detector 10 is the area over which the detector device absorbs energy or in other words the area over which the detector device is responsive to incident energy.

The '915 patent discloses that the active area on the elevated microbridge detector level 11 is maximized in order to maximize the fill factor of the bolometer detector device and to therefore increase the sensitivity of the bolometer detector 10. Thus, the '915 patent discloses increasing sensitivity of the detector device 10 by increasing isolation of the bolometer detector device by placing the active area on the upper microbridge level 11, and by maximizing the size of the active area. In addition, the '976 patent discloses that in order to maximize absorption of incident IR radiation in the operating band, a thickness t of all of the layers 20, 21, 22, 23 and the distance d between the upper level 11 and the reflecting layer 18 are chosen to achieve peak absorption over the desired operating wavelength band. More specifically, the thickness t of the layers 20–23 is chosen to optimize a thermal mass of the microbridge level 11 to achieve peak absorption over the desired operating wavelength band, and the distance d is chosen to achieve constructive interference between any energy not initially absorbed by the active area that is reflected from layer 18, and the IR energy initially incident on the upper microbridge level 11.

One problem with the two-level microbridge bolometer detector 10 of FIG. 1 is that it is constructed to operate with a peak absorption sensitivity over a single operating range of wavelengths. In particular, as discussed above, the peak optical absorption wavelength range is determined by the absorption coefficient of the layers of the active area, by selection of the thickness t of layers 20–23 to have an absorption peak over the desired operating wavelength range, and by the shape of the cavity 26. More specifically the distance d between the upper microbridge detector level and the reflective layer 18 is chosen to provide constructive interference properties. However, there is a need for detectors and detector arrays, for example, in threat warning applications such as armored vehicle defense systems and missile warning systems, which can provide a higher probability of detection and reduced false alarm rates by using the detectors and detector arrays over two separate and distinct wavelength ranges of operation. For example, there is a need to eliminate a problem called contrast inversion which results when objects having different temperatures and emissivities have a same radiant emittance in a spectral band. Accordingly, there is a need to provide a detector that operates over at least two wavelength bands.

SUMMARY OF THE INVENTION

It is an object of the present invention to provide an improved microbridge detector structure. More specifically, it is an object of the present invention to provide a dual-band detector assembly that detects incident electromagnetic radiation in two separate and distinct operating bands of the electromagnetic spectrum.

According to one aspect of the invention, a dual-band detector device detects incident radiation in a first range of wavelengths and in a second range of wavelengths. The dual-band detector includes a semiconductor substrate, a first microbridge detector level, and a second microbridge detector level. The first microbridge detector level is disposed above the semiconductor substrate and includes a first sensing element that absorbs incident radiation in the first range of wavelengths of incident radiation. The second microbridge detector level is disposed above the semiconductor substrate and includes a second sensing element that absorbs incident radiation in the second range of wavelengths. In addition, the dual-band detector includes a first coupling means that couples a first detected signal from the first sensing element, in response to the incident radiation in the first range of wavelengths, to the semiconductor substrate, and a second coupling means that couples a second detected signal from the second sensing element, in response to the incident radiation in the second range of wavelengths, to the semiconductor substrate.

In one embodiment of the dual-band detector, the second microbridge detector level is disposed above the first microbridge detector level. For this embodiment, a reflective layer can be disposed on the semiconductor substrate so that a cavity exists between the first microbridge detector and the reflective layer and a cavity exists between the second microbridge detector and the reflective layer. Either alternatively or in addition, a reflective layer can also be disposed on the first microbridge level, that is transmissive to incident radiation in the first range of wavelengths but reflective to wavelengths in the second range of wavelengths, so that a cavity exists between the first microbridge level and the second microbridge level. In another embodiment of the dual-band detector, the first microbridge detector level is disposed adjacent the second microbridge detector level and each of the first microbridge detector level and the second microbridge detector level are disposed above a respective reflective layer. With these arrangements, the dual-band, detector can detect incident radiation in the first range of wavelengths and in the second range of wavelengths. In addition, with these arrangements the dual-band detector can be fabricated using existing processing techniques.

According to another aspect of the invention, a dual-band detector absorbs incident radiation in a first range of wavelengths and in a second range of wavelengths. The dual-band detector has a semiconductor substrate including a detector device that absorbs incident radiation in the first range of wavelengths of incident radiation and a microbridge detector level including a sensing element that absorbs incident radiation in the second range of wavelengths of the incident radiation. In addition, the dual-band detector includes a coupling means for coupling a detected signal from the sensing element to the semiconductor substrate in response to the incident radiation in the second range of wavelengths. In one embodiment of the dual-band detector the sensing element on the microbridge detector level is disposed above the detector in the semiconductor substrate. In another embodiment of the dual-band detector, the sensing element on the microbridge detector level and the detector in the semiconductor substrate are disposed adjacent to one another. With these arrangements, the dual-band detector can absorb incident radiation in the first range of wavelengths and can also absorb radiation in the second range of wavelengths. In addition, with these arrangements, the dual-band detector can be fabricated using conventional processing techniques.

BRIEF DESCRIPTION OF THE DRAWINGS

Other objects and features of the present invention will become apparent from the following detailed description when taken in connection with the following drawings. It is to be understood that the drawings are for the purpose of illustration only and are not intended as a definition of the limits of the invention.

The foregoing and other objects and advantages will be more fully appreciated from the following drawing in which:

FIGS. 12a, 12b and 12c illustrate, respectively, a helmet mounted and a goggle mounted configuration of a head mounted embodiment of the imaging system of FIG. 11;

FIGS. 14a, 14b and 14c illustrate another embodiment of the imaging system of FIG. 11 which is a hand-held imaging system, in particular FIG. 14a illustrates a monocular system and FIGS. 14b–14c illustrate a binocular system;

FIG. 15a illustrates a top view of the weapon sight and FIG. 15b illustrates a block diagram of the weapon sight;

FIG. 16a illustrates a cross-sectional view of the camcorder and FIG. 16b illustrates a block diagram of the camcorder;

FIG. 17a is a side elevational view of the microscope and FIG. 17b is a block diagram of the microscope; FIG. 18a illustrates a cross-sectional view of the imaging radiometer/spectrometer and FIG. 18b illustrates a block diagram of the imaging radiometer/spectrometer.

DETAILED DESCRIPTION OF THE INVENTION

Figure 1:
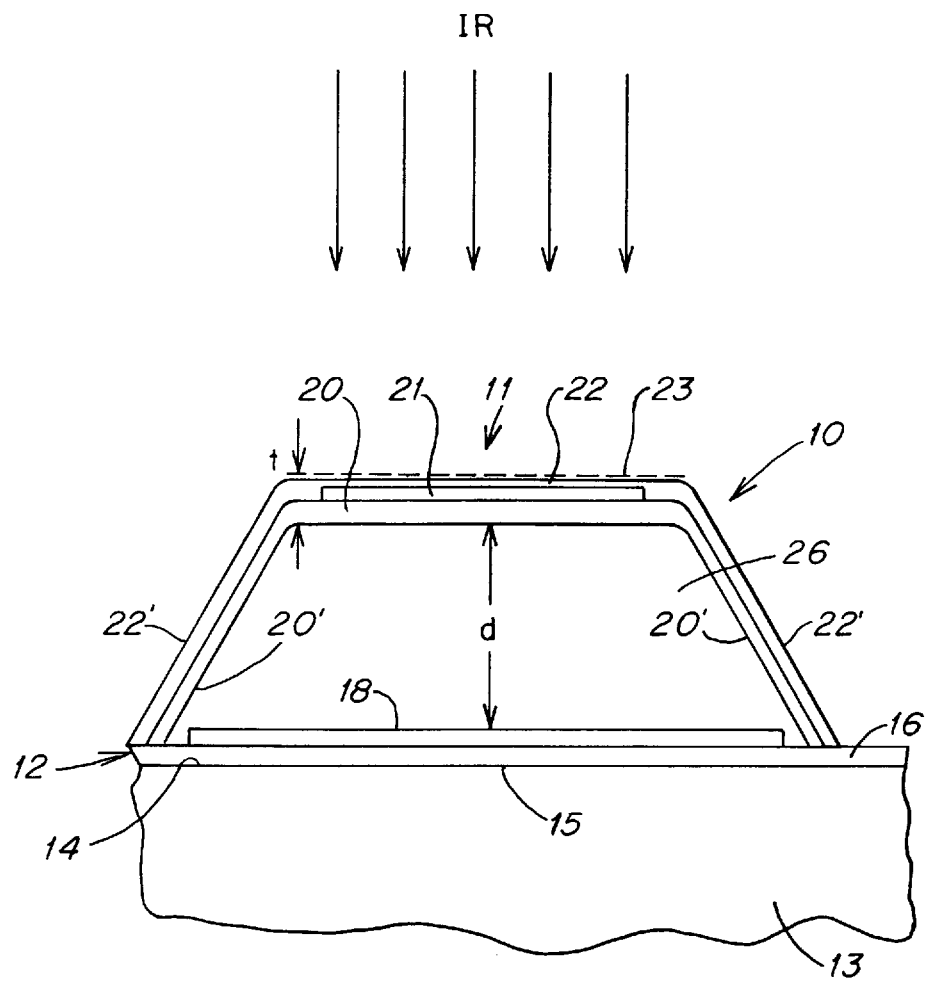
FIG. 1 illustrates a two-level bolometer detector device having an elevated microbridge detector level, according to the related art.
Figure 2:
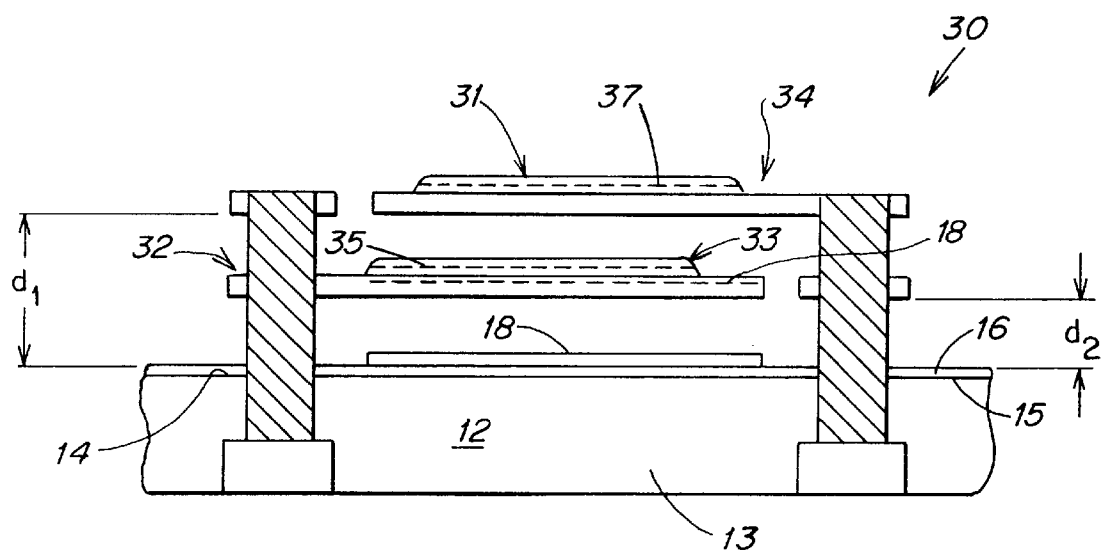
FIG. 2 is a side elevational view of a dual-band detector device according to a first embodiment of the present invention.

FIG. 2 is a side elevation view of a dual-band detector device according to a first embodiment of the present invention. It is to be understood that a detector device for this specification is any device that includes a sensing element that provides an electrical signal in response to a change in temperature within the sensing element, for example as a result of a detected electromagnetic signal. The detector device can be, for example, a bolometer detector, a photon detector, a ferroelectric detector, a diode detector and the like. It is also to be understood that for this specification a sensing element is any structure that measures a physical parameter such as for example, temperature, stress, and the like. Parts similar to that of FIG. 1 are designated by like reference numbers.

As discussed above with respect to FIG. 1, the detector device 30 of the present invention has a lower level 12 that includes a semiconductor substrate 13 having fabricated thereon components of an integrated circuit 15. It is to be appreciated that numerous components such as for example diodes, bus lines, connections, contact pads, and the like can be fabricated using conventional fabrication technology and that such components are intended. In particular, an electronic readout circuit for a detector or an array of detectors, as will be discussed in more detail below, and such is disclosed in co-pending U.S. patent application Ser. No. 08/919,889 filed on Aug. 28, 1997, currently pending, which is a file-wrapper continuation application of Ser. No. 08/797,687 filed on Jan. 13, 1997, now abandoned, which is a file wrapper continuation of 08/521,266 filed on Aug. 30, 1995, now abandoned herein incorporated by reference, can be disposed in the semiconductor substrate 13 and is intended.

Figure 3:
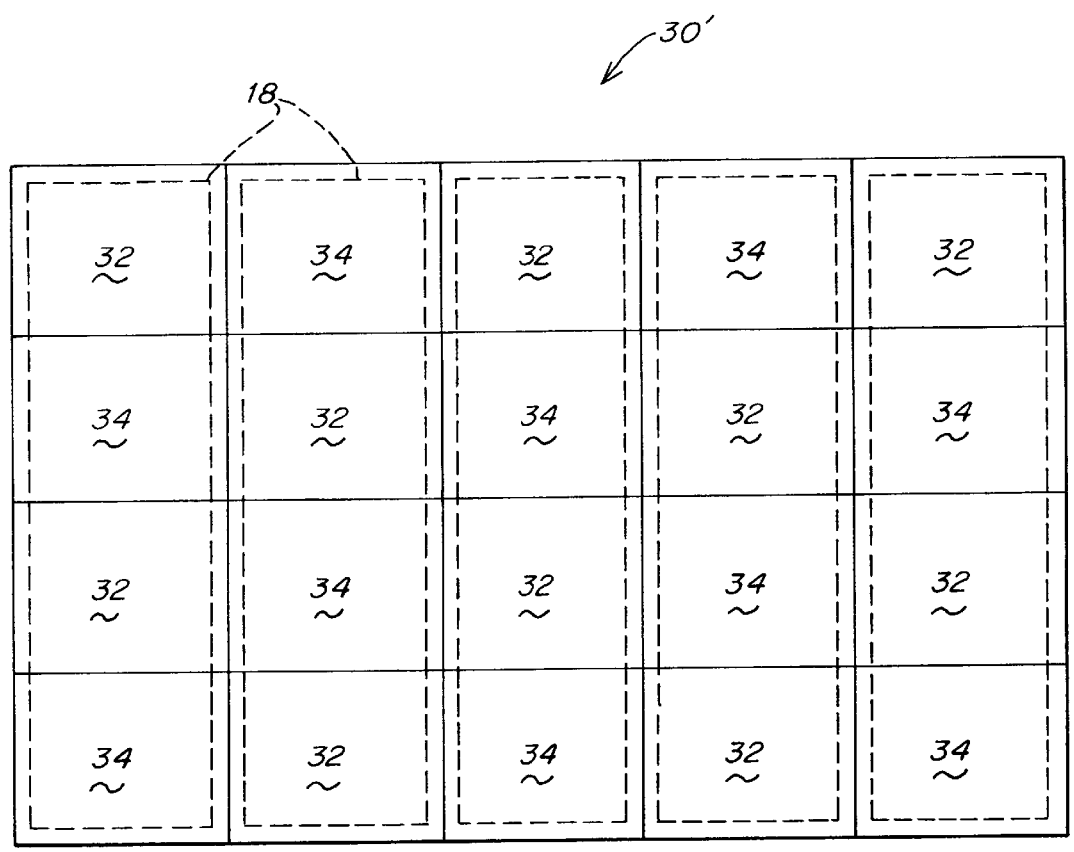
FIG. 3 is a top plan view of an array of dual-band detector devices, according to a second embodiment of the present invention.

The embodiment 30 of FIG. 2 includes a first microbridge level 32 disposed vertically above the substrate 13 and a second microbridge level 34 disposed vertically above both the first microbridge level 32 and the substrate 13. It is to be understood that for the specification a microbridge is any structure that is suspended above any surface. It is to be appreciated that although the embodiment of FIG. 2 illustrates that the first microbridge level is disposed above the semiconductor substrate and below the second microbridge level, various alterations and modifications to this structure are intended to be within the scope of the present invention. For example, one alternative is to provide the first microbridge level and the second microbridge level adjacent to one another, each disposed above the substrate, such that an array of first and second microbridge levels form a checkerboard pattern, as is illustrated in FIG. 3. In particular, FIG. 3 illustrates a top plan view of an array of dual-band detectors according to a second embodiment 30' of the present invention.

Each microbridge level 32 and 34, as illustrated in FIGS. 2–3, includes a sensing element that absorbs incident electromagnetic radiation over a corresponding wavelength band of interest. In addition, in the embodiment 30 of FIG. 2, the second microbridge level 34 allows to pass (or does not absorb) electromagnetic radiation outside of the corresponding wavelength band of interest. In the illustrative embodiments of FIGS. 2–3, the second microbridge level 34 preferably has a sensing element that absorbs incident electromagnetic radiation in a long wave (LW) band of interest and the first microbridge level 32 preferably has a sensing element that absorbs incident electromagnetic radiation in a medium wave (MW) band of interest. For example, the sensing element that absorbs incident radiation in the LW band of interest preferably absorbs incident radiation having a wavelength in a range of 8 to 14 microns and the sensing element that absorbs incident radiation in the MW band of interest preferably absorbs incident radiation in a wavelength range from 3 to 5 microns.

In the dual-band detector device 30, 30' of FIGS. 2–3, the sensing element on the second microbridge level 34 is designed for LW operation by choosing appropriate absorbing materials to be placed in an active area 31, disposed on the second microbridge level 34, and by selecting a cavity design between the second microbridge level 34 and the reflector 18. For example, silicon nitride is one suitable material that can be placed in the active area on the second microbridge level, wherein the silicon-nitrogen bonds of the silicon nitride provide absorption in a wavelength range of at least 10 to 12 microns. A distance $d_1$ between the second microbridge level and the reflector 18 is chosen to provide an optical cavity between the second microbridge level 34 and the reflector 18 that supplements the silicon nitride absorption in the wavelength range of 8 to 10 microns. It is to be appreciated that, for the embodiment as illustrated in FIG. 2, the distance $d_1$ will be less than the corresponding distance in the dual-band detector structure of FIG. 3 since the distance $d_1$ is reduced slightly to account for an increase in the optical path length provided to the electromagnetic signal, that is not initially absorbed by the second microbridge level 34, as it passes through the first microbridge level 32.

In the illustrative embodiment 30, 30' of FIGS. 2–3, the sensing element on the first microbridge level 32 is optimized for the MW absorption by a proper choice of absorbing materials for an active area 33 placed on the first microbridge level 32. It is to be appreciated that for the embodiment of FIG. 2, the first microbridge level also allows to pass (or does not absorb) electromagnetic radiation outside of the corresponding wavelength band of interest. For example, for the embodiment of FIG. 2 the active area 33 can be fabricated with a custom plasma deposited polymer having a low LW absorption characteristic and a high MW absorption characteristic. In addition, for each of the embodiments of FIGS. 2–3, a distance $d_2$ between the first microbridge level 32 and the reflector 18 is optimized to form the optical cavity in the MW range. The specific value of $d_2$ is determined to compliment the active area absorption characteristics.

One alternative embodiment of the dual-band detector of FIG. 2 is to include the reflector 18 on the first microbridge level thereby providing a cavity between the first microbridge level and the second microbridge level. For this embodiment the reflector 18 should be reflective to electromagnetic energy in the LW wavelength band and substantially transmissive to electromagnetic energy in the MW wavelength band. The reflector can be made of any material or any structure that is reflective to the LW wavelength band and transmissive to the MW wavelength band such as, for example, a mesh or web-type structure or a coating have these properties.

Referring to FIG. 3, still another approach for optimizing each of the first microbridge level and the second microbridge level for peak absorption over the desired wavelength operating bands, is to optimize the cavity formed between the first microbridge level 32 and the reflector 18, and the cavity formed between the second microbridge level 34 and the reflector 18. In other words, the absorbing materials making up the active areas 31 and 33, on each of the first microbridge level 32 and the second microbridge level 34, are selected to absorb incident radiation over a broad range of wavelengths (are not specifically optimized for absorption in the desired wavelength band of interest), and the optical cavity absorption characteristics are tailored to the wavelength band of interest. For this embodiment any materials that have absorption characteristics in the wavelength band of interest are acceptable as an absorbing layer for the active areas 31 and 33 of the first microbridge level and the second microbridge level.

In the illustrative embodiments 30, 30' of FIGS. 2–3 each of the first microbridge level and the second microbridge level are also provided with a respective high thermal coefficient of resistance (TCR) material 35 and 37. The absorbing layer making up the active areas 33 and 31 and the respective high TCR material 35, 37 on each of the first microbridge level and the second microbridge level act together to absorb incident radiation in the band of interest, and to convert the absorbed radiation to heat. More specifically, the absorbed radiation produces a temperature change in the high TCR material which is sensed by measuring a resistance change of the high TCR material.

Figure 4:
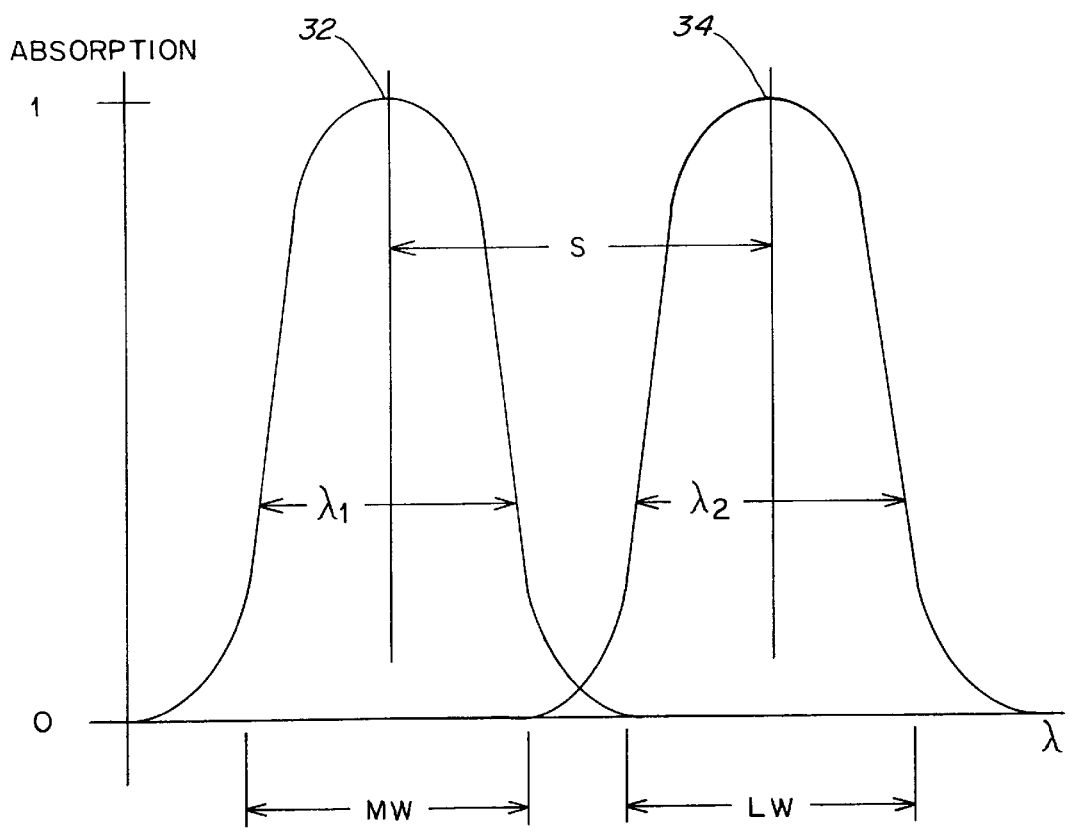
FIG. 4 illustrates an absorption coefficient as a function of wavelength for each of the detectors of the dual-band detector devices of FIGS. 2–3.

FIG. 4. illustrates a performance of the dual-band detector devices 30, 30' of FIGS. 2–3 and more specifically an absorption sensitivity, normalized to a range of 0 to 1, as a function of wavelength for each of the first microbridge level 32 and the second microbridge level 34. As illustrated in FIG. 4, the first microbridge level 32 absorbs incident electromagnetic radiation in a first range of wavelengths $\lambda_1$ and the second microbridge level 34 absorbs incident electromagnetic radiation in a second range of wavelengths $\lambda_2$. It is to be appreciated, as discussed above, that for the embodiment of the dual-band detector illustrated in FIG. 2, outside of the wavelength bands of interest $\lambda_1$ and $\lambda_2$, the first microbridge level and the second microbridge level pass the incident electromagnetic radiation or in other words do not absorb the incident electromagnetic radiation. It is also to be appreciated that for the embodiment of FIG. 3, the first microbridge level and the second microbridge level need not pass the electromagnetic radiation outside of the wavelength band of interest, although they can be designed to do so if desired. It is to be appreciated that a spacing (S) between the first wavelength band of interest $\lambda_1$ and the second wavelength band of interest $\lambda_2$ can be varied to achieve absorption over two different wavelength bands of interest and that the spacing S is not limited to any particular value. It is also to be appreciated that the spacing S should at a minimum be a distance such that a desired rejection exists between the first microbridge operating at the first wavelength band of interest and the second microbridge operating at the second wavelength band of interest.

Fabrication of the dual-band detector structure 30, 30' of FIGS. 2–3 utilizes existing microbridge processing techniques with the addition of process steps tailored to provide two microbridge detector levels operating over two wavelength bands. In particular, fabrication of the embodiment of the dual-band detector of FIG. 2 utilizes the process as disclosed in the '976 and the '915 patents through construction of the lower microbridge level 32, with the distance $d_2$ being customized for absorption of incident radiation in the MW range. Additional process steps are also provided to fabricate the second microbridge level 34. More specifically, referring to FIG. 5 a sequence of fabrication steps for the dual-band detector structure 30 of FIG. 2 is now described.

Following deposition of the silicon nitride layer 16 on the lower level 12, a thin film layer 18 of reflective material, for example such a metal film Pt or Au, is deposited. Construction of the lower microbridge level 32 and the upper microbridge level 34 is then commenced. A sacrificial layer (not shown) having a thickness $d_2$, for example phos-glass, undoped glass or any other easily soluble material, is deposited on top of the silicon nitride layer 16 and sloped walls 36 and 36' are provided in the sacrificial layer. The vertical distance $d_2$ between the first microbridge level 32 and the reflective layer 18 is provided so that the reflected incident electromagnetic radiation from layer 18 is reflected toward the first microbridge level 32 and has constructive interference properties such that absorption is achieved over the MW range of electromagnetic radiation. A first silicon nitride base layer 20, 20' is then deposited on the sloped walls 36, 36' and on the first microbridge level 32. A resistive film layer 35, having a high TCR, is then deposited on the first microbridge level 32, and connections from the first microbridge level 32 down to contact pads (not illustrated) on level 12 are then provided in the form of conductive legs disposed in sloped walls 36 and 36'. The active area 33 is completed with a silicon nitride passivation layer 22, 22' deposited to cover the layers 35 and 20 on the first microbridge level 32 and the sloped walls 36, 36'. A thin film absorbing layer 23 can optionally be deposited on top of the silicon nitride passivation layer 22.

These steps are then repeated to provide the second microbridge level 34 in a similar manner. In particular, a second sacrificial layer (not shown), for example phos-glass, undoped glass, or any other easily soluble material, having a thickness $d_1-d_2$ is deposited on top of the first microbridge level 32 and sloped walls 38 and 38' are provided in the second sacrificial layer. As discussed above, the vertical distance $d_1$ between the second microbridge level 34 and the reflective layer 18 is chosen so that reflected electromagnetic radiation from layer 18 is reflected toward the second microbridge level 34 to provide constructive interference with the energy initially incident on layer 34, for the LW band of interest. A silicon nitride layer 40, 40' is then deposited on the sloped walls 38, 38' and on the second microbridge level 34. A resistive film layer 37 having a high TCR is then deposited on the second microbridge level 34, and appropriate connections from the second microbridge level 34 down to contact pads (not illustrated) on the semiconductor substrate level 12 are provided in the form of conductive legs disposed in sloped walls 38 and 38'. The active area 31 is completed with a silicon nitride passivation layer 44, 44' disposed on top of the silicon nitride layer 40, 40' and the high TCR material 37. A thin film absorbing layer 46 can optionally be deposited on the silicon nitride passivation layer 44.

The first and second sacrificial layers of undoped glass or other easily soluble material are then dissolved from beneath the first microbridge level 32 and the second microbridge level 34 to form the optical cavities having the distance $d_1$ and $d_2$ between the reflective layer 18 and the respective microbridge levels 34 and 32.

Figure 5:
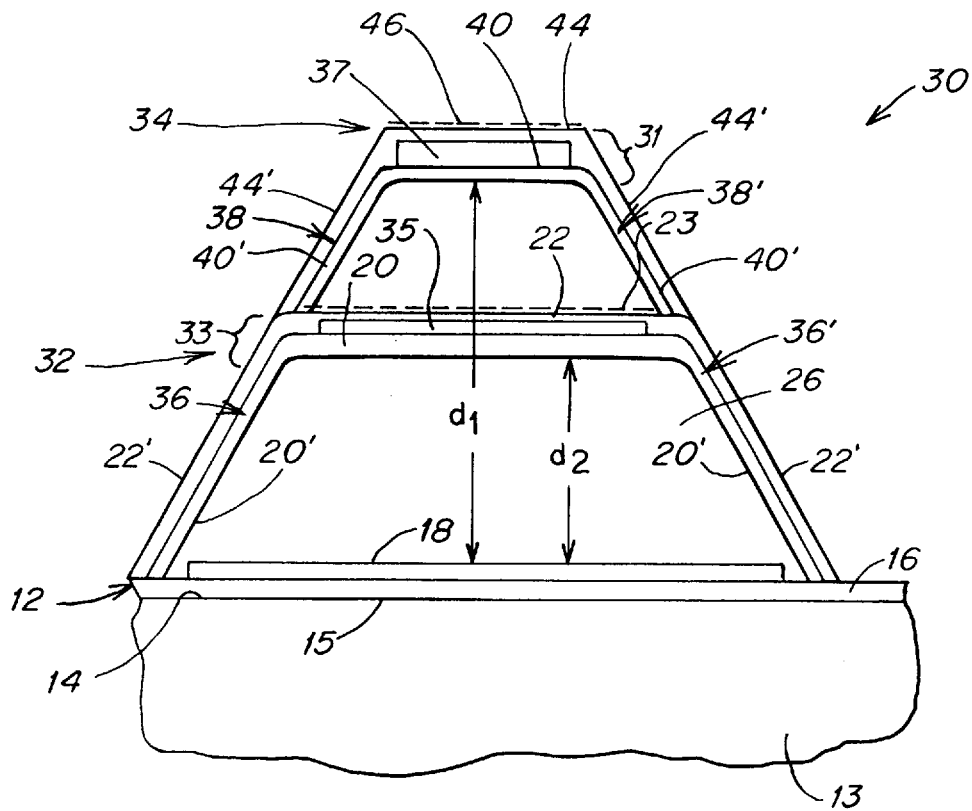
FIG. 5 illustrates a side elevational view illustrating various layers for fabricating the dual-band detector of FIG. 2.

As illustrated in FIG. 5, the conductive legs, disposed in sloped walls 36 and 36' and sloped walls 38 and 38', provide contact between the first microbridge level 32 and the substrate level 12 as well as between the second microbridge level 34 and the substrate 12. The conductive legs allow the second microbridge level and the first microbridge level to be independently addressed and thus allow any one of simultaneous or sequential coupling of a sensed signal from the second microbridge level 34 and a sensed signal from the first microbridge level 32, to the substrate level 12. However, it is also to be appreciated that any contact structure known to one of ordinary skill in the art is within the scope of the present invention and is intended. For example, the contact structure can be standard etched contacts or filled vias such as disclosed in FIG. 2. An advantage of the etched contacts or filled vias disclosed in FIG. 2 is that significant space is saved in the fabrication of the dual-band, multi-level detector device. In addition, the etched contacts or filled vias provide the structural support for the first microbridge level 32 and the second microbridge level 34 and allow the first microbridge level 32 and the second microbridge level 34 to be independently addressed to provide either one of simultaneous or sequential MW and LW sensed signal data to the substrate level 12.

Figure 6:
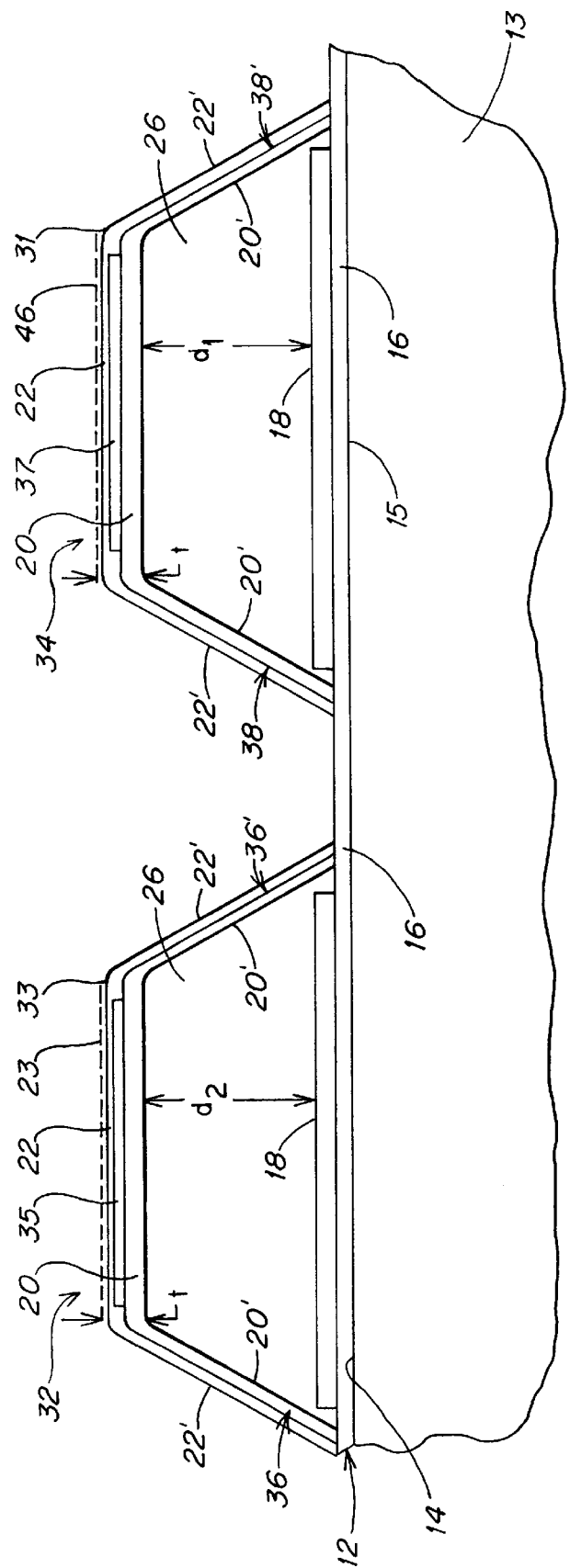
FIG. 6 illustrates a side elevational view illustrating various layers for fabricating the dual-band detector of FIG. 3.

The embodiment 30' of the dual-band detector of FIG. 3 can also be fabricated utilizing the process as disclosed in the '976 and '915 patents, with distances $d_1$ and $d_2$ being customized for absorption of incident radiation in the LW and MW bands of interest, respectively. More specifically, referring to FIG. 6, a sequence of fabrication steps for the dual-band detector of FIG. 3 will now be described.

Following deposition of the silicon nitride layer 16 on the lower level 12, a thin film layer 18 of reflective material, for example, such as metal film Pt or Au, is deposited. A sacrificial layer having a thickness $d_2$ for the first microbridge level 32 and having a thickness $d_1$ for the second microbridge level 34, for example undoped glass, phos-glass or any other easily soluble material, is deposited on top of the silicon nitride layer 16. Sloped walls 36, 36' and 38, 38' are then provided in the sacrificial layer. A first level silicon nitride layer 20, 20' is then deposited on the sloped walls 30, 30' and 31, 31' to form a base for each of the first microbridge level 32 and the second microbridge level 34, respectively. The respective resistive film layers 35, 37 having the high TCR are then deposited on each of the first microbridge level 32 and the second microbridge level 34, and connections from each of the first microbridge level and the second microbridge level down to contact pads (not illustrated) on level 12 are provided in the form of conductive legs disposed in the sloped walls 30, 30' and 31, 31'. The respective active areas 33, 31 are completed with a silicon nitride passivation layer 22, 22' deposited to cover the resistive film layer and the first silicon nitride layer on each of the first microbridge level and the second microbridge level, as well as the sloped walls. An optional, respective thin film absorbing layer 23, 46 can also be deposited on top of the silicon nitride passivation layer, on each of the first microbridge level and the second microbridge level. The first and second sacrificial layers of phos-glass or other easily soluble material are then dissolved from beneath the first microbridge level and the second microbridge level to form the cavities 26 having a respective distance $d_1$ and $d_2$ between the reflective layer 18 and the second microbridge level, and between the reflective layer 18 and the first microbridge level.

Figure 7:
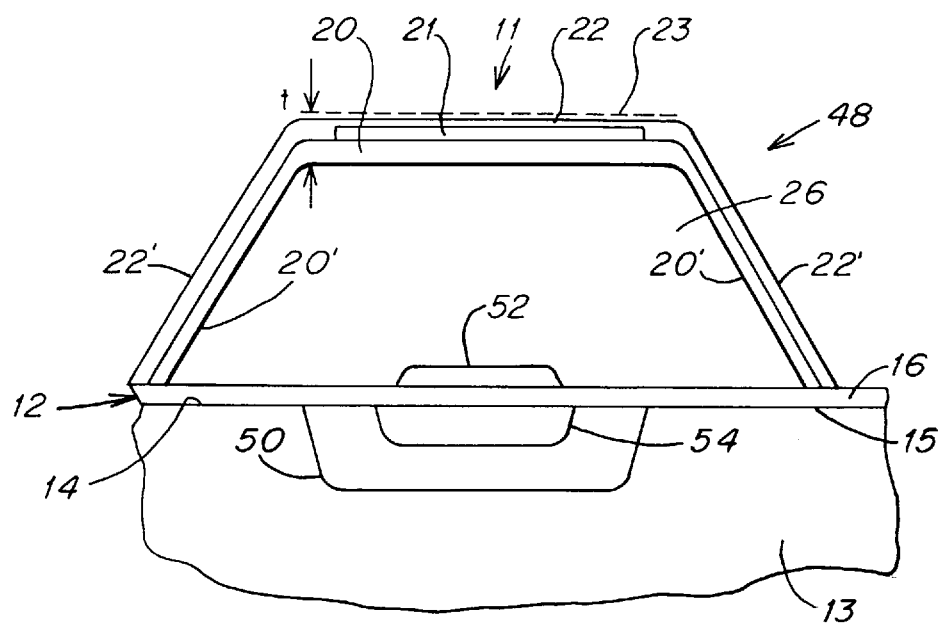
FIG. 7 illustrates an additional embodiment of a dual-band detector device according to the present invention.

FIG. 7 illustrates another embodiment of a dual-band detector device 48, according to the present invention. Parts similar to that described above are provided with like reference numerals. In the illustrative embodiment of FIG. 7, the dual band detector 48 is provided with a microbridge level 11 including a sensing element for detecting incident electromagnetic radiation in a first band of wavelengths. The microbridge level 11 is disposed above a detecting element 50 in the substrate 13 which detects incident electromagnetic radiation in a second band of wavelengths. In the illustrative embodiment of FIG. 7, the sensing element on the first microbridge level 11 preferably detects incident radiation in an infrared (IR) band of wavelengths, for example incident radiation having a wavelength in a range of 8 to 14 microns, and the detector element 50 preferably detects incident electromagnetic radiation in a visible range of wavelengths. For example, the detector element 50 may be a semiconductor detector that detects visible light in a manner such as known in the art of charge coupled devices (CCDs). In a preferred embodiment, the visible detector element 50 is a CCD having a photo gate 52 disposed above the insulating layer 16 on the substrate 13 and is biased to provide a depletion region 54 underneath the gate and in the semiconductor substrate 13, which collects charge created within the substrate 13 by absorption of visible light in the second band of wavelengths. The collected charge is periodically sampled using any number of known techniques used in the art of CCD or CMOS switched circuits, as will be discussed in more detail below.

Figure 8:
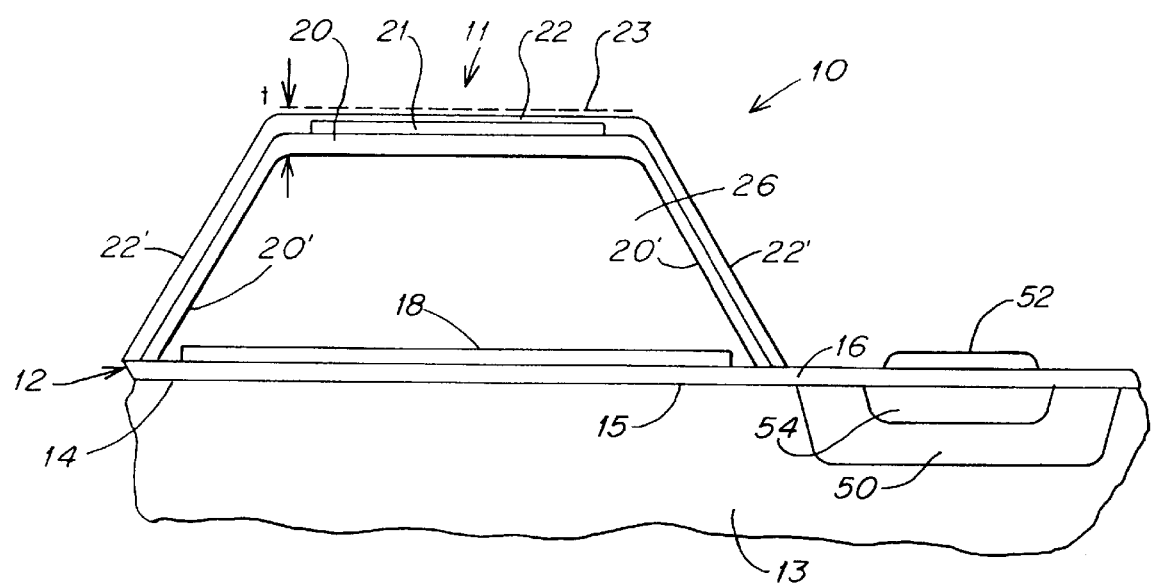
FIG. 8 illustrates still another embodiment of a dual-band detector device according to the present invention.

It is to be appreciated that although one illustrative embodiment of a dual-band sensor operating in the IR range and in the visible range has been illustrated in FIG. 7, various alterations and modifications can be made and are intended to be within the scope of the present invention. For example, one alternative embodiment is to provide the detector element 50 adjacent the IR detector on a microbridge structure 11 as illustrated in FIG. 8. The dual-band sensor of FIG. 8, when placed in an array will form a checkerboard pattern such as illustrated in FIG. 3. For this embodiment, it is to be appreciated that the IR detector on the microbridge element can be provided with a reflector 18 disposed below the microbridge level, to provide a cavity to enhance absorption over the IR band of wavelengths. Another alternative embodiment is to backside illuminate the detector device 50 of FIG. 7 so that the second microbridge level 11 need not pass incident electromagnetic radiation in the visible operating range. Still another alternative embodiment is to use a photodiode or any other semiconductor device instead of a CCD in either of the above configurations, that collects charge as a result of absorption of visible light in the second band of wavelengths.

Although the above description with respect to FIGS. 2–8 has been in terms of individual detector devices, the invention is also directed to an array assembly, in particular to an array in the in x and y dimensions of a plurality of dual-band detector devices thereby forming a focal plane array of dual-band detectors. In particular, the focal plane array of the dual-band detector devices can include any of the dual-band detector devices discussed above and illustrated in FIGS. 2–8.

Figure 9:
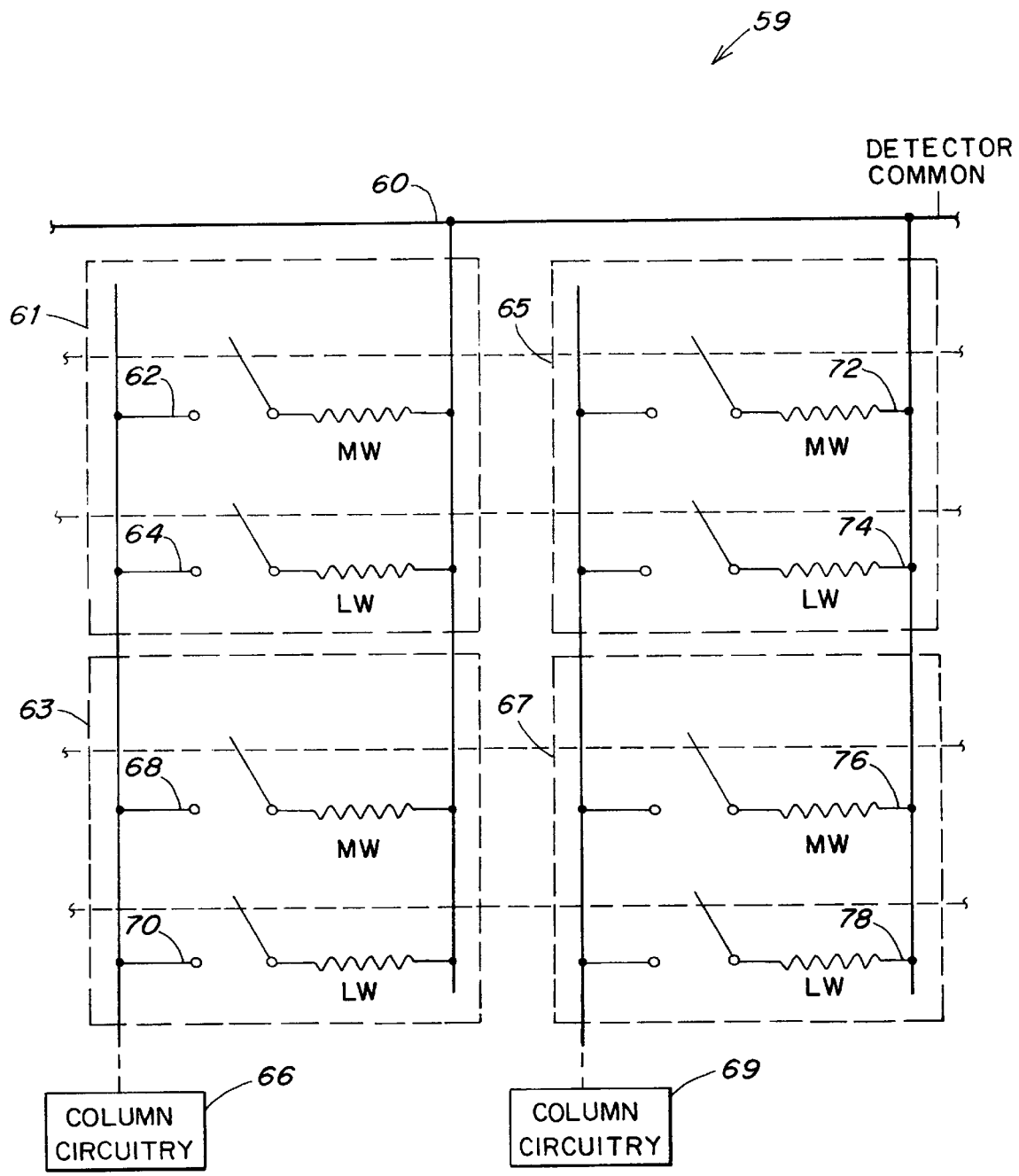
FIG. 9 illustrates a schematic diagram of an embodiment of an electronic readout circuit to be used with an array of dual-band detectors, according to the present invention.

As discussed above, the semiconductor substrate can be provided with read-out circuitry such as described in co-pending U.S. patent application Ser. No. 08/521,266, entitled "Bolometric Focal Plane Array" filed on Aug. 30, 1995. FIG. 9 illustrates a schematic diagram of an embodiment 59 of an electronic readout circuit to be used with an array of dual-band detectors, such as illustrated in FIGS. 2–3 according to the present invention. The electronic readout circuitry 59 of FIG. 9 is similar to that of co-pending U.S. Patent application No. 08/521,266, except that each unit cell 61, 63, 65, 67 associated with each dual-band detector has respective circuitry to switch the detector in the first operating band and also to switch the detector in the second operating band. In particular, the electronic readout circuit 59 periodically pulses each of the detectors 34 for the first operating band of wavelengths and each of the detectors 32 for the second operating band of wavelengths, and measures a signal resulting from radiation induced changes in each of the detectors. In a preferred embodiment, the second operating band of wavelengths are in the MW band of interest and the first operating band of wavelengths are in the LW band of interest. For example, the electronic readout circuit 59 can be used with an array of detectors as illustrated in FIGS. 2–3, to pulse and measure the induced signal from each of the LW and the MW detectors.

In the embodiment of FIG. 9, the readout circuit preferably uses a common detector line 60 which is common to both the detectors in the first operating band of wavelengths and the detectors in the second operating band of wavelengths, and also uses separate row enable lines 62, 64, 68, 70, 72, 74, 76, 78 and column circuitry 66, 69 to turn on the detectors in the first operating band of wavelengths and to turn on the detectors in the second operating band of wavelengths, sequentially. It is to be appreciated that although one particular embodiment of readout circuitry has been illustrated in FIG. 9, various alterations and modifications known to those skilled in the art can be made and are intended. For example, one modification is to use one column circuit and one row select line for the detectors in the first operating band and the detectors in the second operating band, but at different times. In addition, an alternative embodiment is to provide independent circuitry for each of the detectors in the first operating band and each of the detectors in the second operating band.

Figure 10:
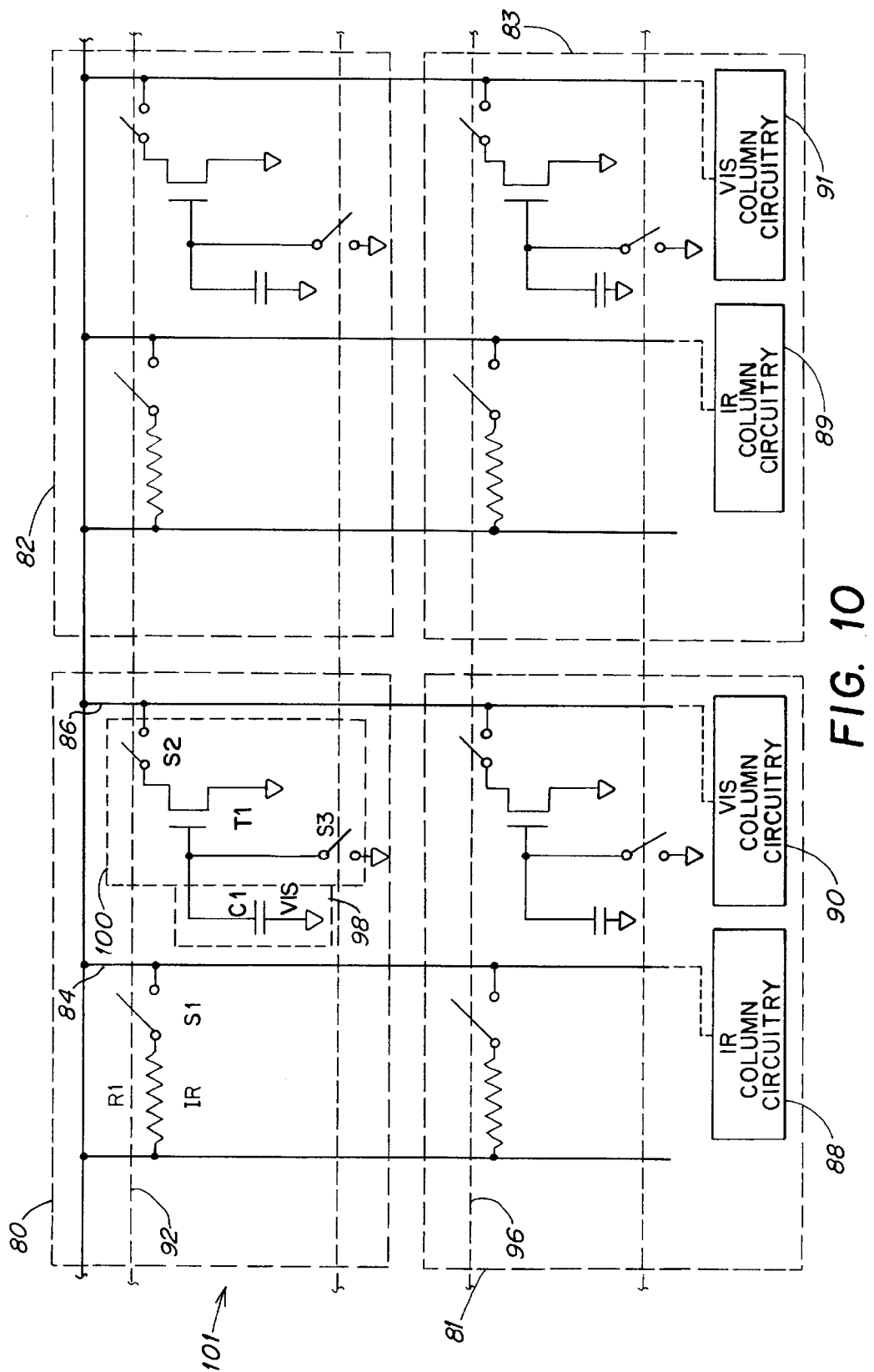
FIG. 10 illustrates a schematic diagram of another embodiment of a readout circuit to be used with an array of dual-band detectors, according to the present invention.

Referring now to FIG. 10, there is disclosed a schematic diagram of a readout circuit 101 to be used with an array of dual band detectors according to an alternate embodiment of the present invention. The electronic readout circuit 101 can be used with an array of detectors as illustrated in FIGS. 7–8, wherein each unit cell 80, 81, 82, 83 is associated with a corresponding dual band detector such as illustrated in FIG. 7. Each unit cell 80, 81, 82, 83 contains readout circuitry for the IR sensing element and the visible detector 50 of the dual-band detector of FIG. 7–8.

More specifically, according to the illustrative embodiment of FIG. 10, there are different column lines 84 and 86 and different column circuitry 88, 89 and 90, 91 for each of the infrared detector and the visible detector, respectively. A common row select line 92, 96 is shared to select a row of detectors, which are in turn multiplexed onto column lines 84 and 86 which are shared among the rows. The readout circuit for the IR sensing element of the dual band detector of FIGS. 7–8, is illustrated as a single switch within each detector cell 80, 81, 82, 83. For the visible detector 50 of the dual band detector of FIGS. 7–8, the readout circuit includes a detector 98 and a readout circuit 100 within each unit cell 80, 81, 82, 83. The readout circuit 100 includes a transistor $T_1$, which is a source follower amplifier for sampling the voltage signal on capacitor $C_1$, and which is one approach to sample the detected signal from detector 98. However, as is known to those of ordinary skill in the art, many possible approaches and circuits exist to sample a signal from a CCD device and such alterations and modification are intended to be within the scope of the present invention. Once the readout circuit 100 has sampled the voltage on the detector 98, the detector capacitor $C_1$ is reset by switch $S_3$.

Figure 11:
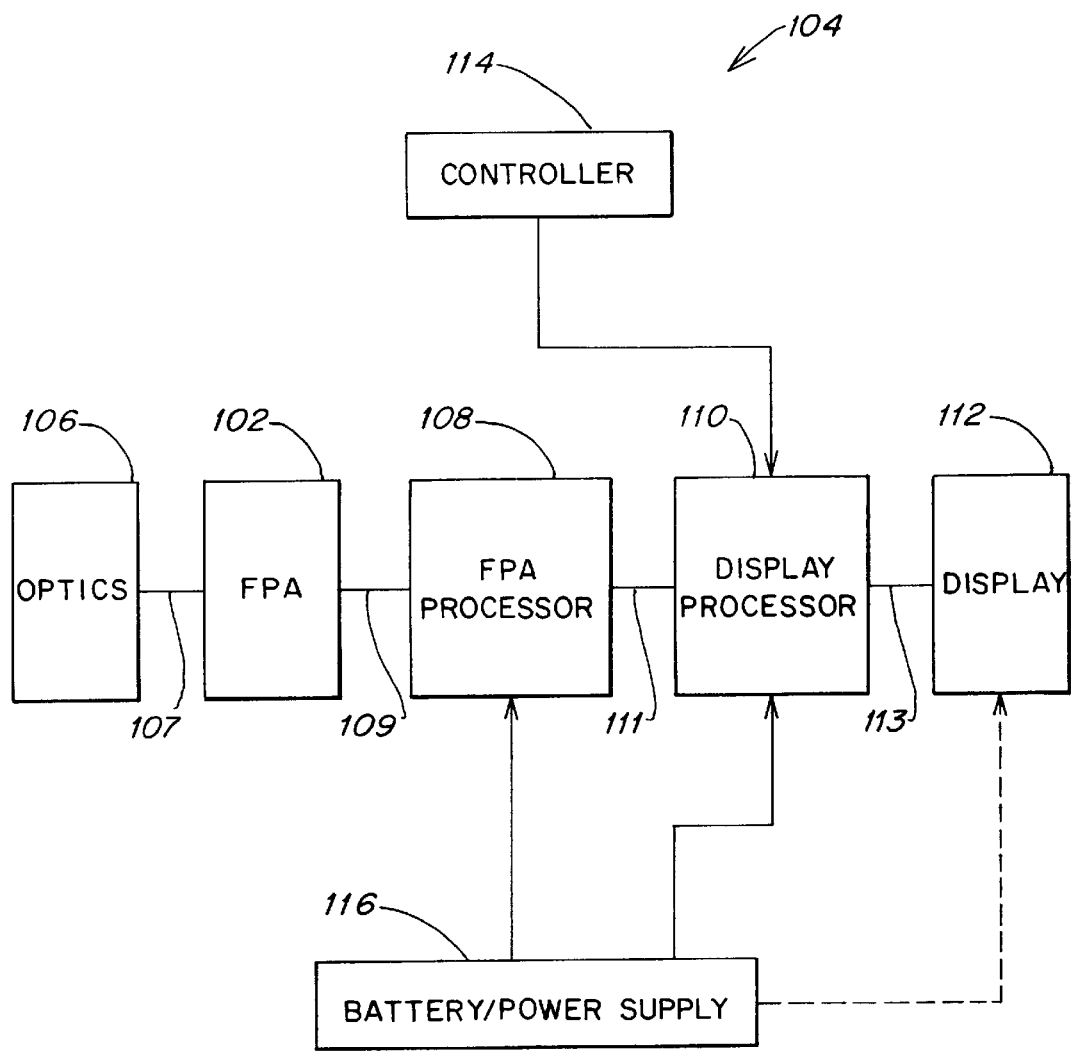
FIG. 11 illustrates a block diagram of an imaging system of the present invention.

It is to be appreciated that an uncooled focal plane array 102 of the present invention can be used in an imaging system 104, such as illustrated in the block diagram of FIG. 11. With the imaging system of FIG. 11, electromagnetic radiation in two operating wavelength bands such as, for example, infrared radiation in a wavelength ranges of 8–14 $\mu$m and 3–5 $\mu$m, incident upon the optics 106, is focussed by the optics such as, for example, a lens to provide a focussed electromagnetic signal at output 107. The focussed electromagnetic signal is imaged onto the uncooled focal plane array 102. The focal plane array converts the focussed electromagnetic signal to a plurality of sensed signals that are output on medium 109, to a focal plane array processor 108. The focal plane array processor 108 processes the plurality of sensed signals such as, for example, by digitizing the plurality of sensed signals to provide a plurality of processed signals and by adjusting the plurality of processed signals for any differences in gain or other non-uniformities between the plurality of dual-band detector devices of the focal plane array. The plurality of processed signals are then output on medium 111 to a display processor 110. The display processor reformats the plurality of processed signals into a plurality of display signals in a format suitable for display on display 112, and outputs the display signals to the display on medium 113. It is to be appreciated that the display processor may perform any display processing of the processed signals known to one of ordinary skill in the art such as, for example, reformatting for the display signals, eliminating bad pixel data, focus adjustment, addition of symbols and/or other information to the display signals, adjustment of brightness and/or contrast, and the like. A controller 114 provides automatic and/or manual control of the display processor to allow automatic and/or manual adjustment of the various display parameters such as for example, the brightness, the contrast, adding symbols, and the like. The imaging system is powered by supply electronics 116 which may include any one of a battery, an AC power supply, or a DC power supply.

The imaging system of FIG. 11 generally provides a 2-dimensional real-time display of an image for an operator of the system to view. For example, in a preferred embodiment of the imaging system of the present invention, the uncooled focal plane array 102 is configured to operate over at least one infrared (IR) wavelength band of interest. With this system, the operator can view thermal signatures of objects and/or scenery under conditions where the human eye would not normally be able to see the objects and/or scenery. For example, the imaging system may be used at night, in the day without washout conditions, in the presence of smoke, or in degraded weather conditions.

One example of a thermal-imaging system in which the focal plane array of the present invention can be utilized is a head mounted imaging system 120 as illustrated in FIGS. 12a–12b. FIG. 12a illustrates a helmet mounted configuration of the head mounted imaging system, FIG. 12b illustrates a goggle configuration of the head mounted imaging system, and FIG. 12c illustrates an exploded view of the goggle configuration of FIG. 12b.

Figure 13:
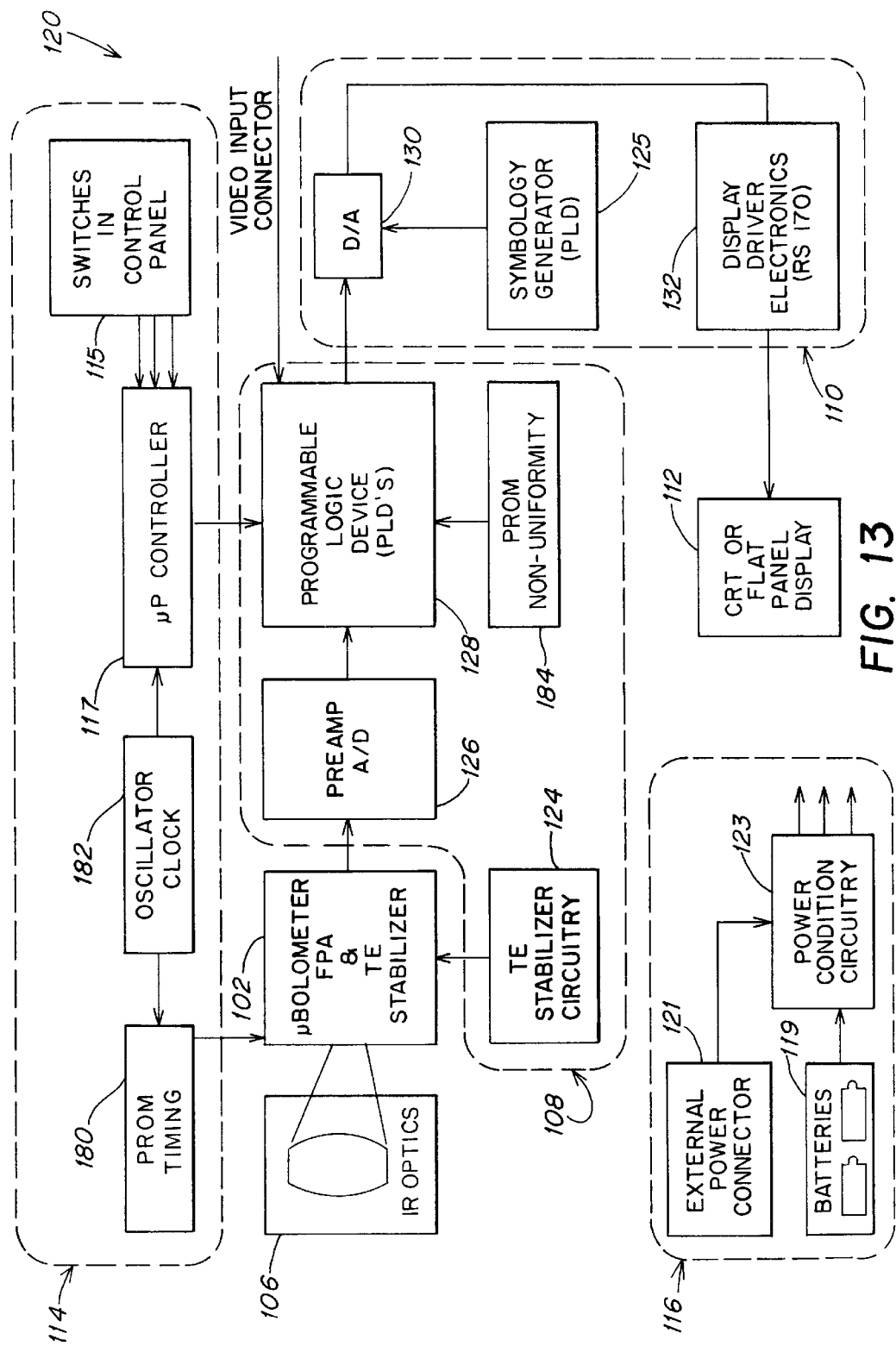
FIG. 13 illustrates a block diagram of the head mounted imaging system of FIGS. 12a, 12b and 12c.

FIG. 13 illustrates a block diagram of the head mounted imaging system 120 of FIGS. 12a–12c. It is to be appreciated that parts similar to the imaging system illustrated in FIG. 11 have been identified with similar reference numbers and any description of these parts is not repeated here. With the head mounted imaging system of FIG. 13, an electromagnetic signal in two wavelength operating bands is focussed by the optics 106 onto the focal plane array 102. The focal plane array 102 is temperature stabilized with the aid of temperature stabilizing circuitry 124 contained within the focal plane array processor 108. The focal plane array 102 converts the focussed signals into sensed signals and outputs the plurality of the sensed signals to the focal plane array processor 108. The focal plane array processor amplifies and digitizes each of the plurality of sensed signals with a preamplifier and analog-to-digital converter 126, and outputs a plurality of processed signals to the display processor 110. The focal plane array processor also includes a programmable logic device 128 that processes the plurality of processed signals to correct any offsets or gain differences between the plurality of processed signals to eliminate any bad signal data, a PROM timing block 180, an oscillator clock 182, and a PROM non-uniformity block 184. The display processor reformats the corrected signals and converts the corrected signals to an analog signal via a digital-to-analog converter 130, so that the analog signal is in a format suitable for display. A display driver 132 then outputs the analog signal to the display 112 for display to the user.

As discussed above, the controller 114 provides automatic and/or manual control of the display processor to provide automatic and/or manual adjustment of various display parameters. The controller of the head mounted system includes switches 115 in a control panel, and a microprocessor 117. In addition, the supply electronics 116 includes batteries 119, or a connector for external power 121, as well as power conditioning circuitry 123. Further, the display processor 110 reformats the plurality of processed signals into the display signal and includes a symbology generator 125 for providing symbols on the display.

In a preferred embodiment of the head mounted system 120, the focal plane array 102 is operated in at least one IR wavelength band, for example over the 8–14 μm range. In addition, the display 112 can be either a one eye or two eye display for the system user, and can be adjusted with the aid of the controller 114. In a preferred embodiment, the focal plane array processor 108 and the display 112 are mounted in the helmet or within the face mounted goggles. In addition, the display processor 110, the controller 114, and the supply 116 are provided in a unit that can be vest mounted. However, it is to be appreciated that any variation known to one of ordinary skill in the art, such as for example, mounting each of the above in the helmet or goggles, is contemplated and intended to be within the scope of the present invention.

An advantage of the head-mounted imaging system is that it is a self-contained, portable unit having a reduced size, weight and power consumption. In particular, the focal plane array does not require cooling, or mechanical scanners or choppers as required by prior art devices. In addition, the head mounted system can operate in darkness, in the daytime without washout in contrast to prior art devices that use an image intensifier tube, can penetrate smoke, and the like. Further, for the reasons discussed above with respect to the bolometer detector device and the focal plane array, the head mounted system has an improved reliability and sensitivity as compared to the prior art devices.

Another example of an imaging system using the focal plane array of the present invention is a hand-held imaging system such as is illustrated in FIGS. 14a, 14b and 14c. The hand-held imaging system can be a monocular system, 134, such as illustrated in FIG. 14a or a binocular system 136 such as illustrated in FIGS. 14b and 14c. It is to be appreciated that parts similar to the imaging system of FIG. 11 are labeled with similar reference numbers, and any description of these elements is not repeated. The monocular system of FIG. 14a includes a window 127 and may have a filter 122 disposed in front of the optics 106, and a focus ring 129 that focuses the incident electromagnetic radiation onto the optics. In addition, the display 112 includes an eye piece 131 which acts in combination with a CRT or FPD 133 to provide the display. The eye piece display 112 also has a diopter adjustment 135, and a focus knob 137, as known to one of ordinary skill in the art. In a preferred embodiment of the hand-held imaging system of FIGS. 14a, 14b and 14c, the supply electronics 116 is a battery, and the focal plane array operates over at least one IR wavelength range to yield a long range IR telescope or binoculars that can be used in darkness, in daylight, to penetrate smoke, and the like. In addition, the long range telescope and binoculars are self-contained units having a reduced side, weight and power consumption, while providing an increased reliability and sensitivity.

Figure 15A:
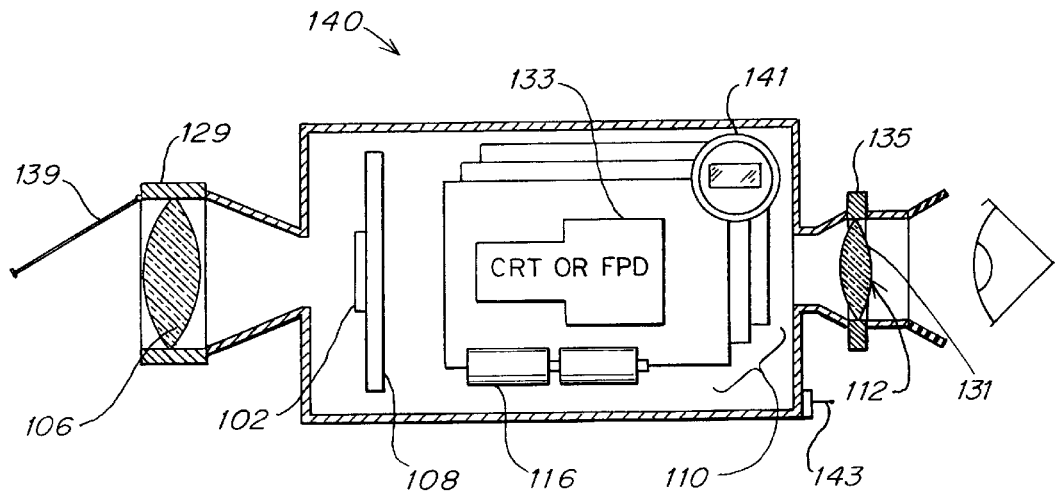
FIGS. 15a and 15b illustrate another embodiment of the imaging system of FIG. 11 which is a weapon sight, in particular
Figure 15B:
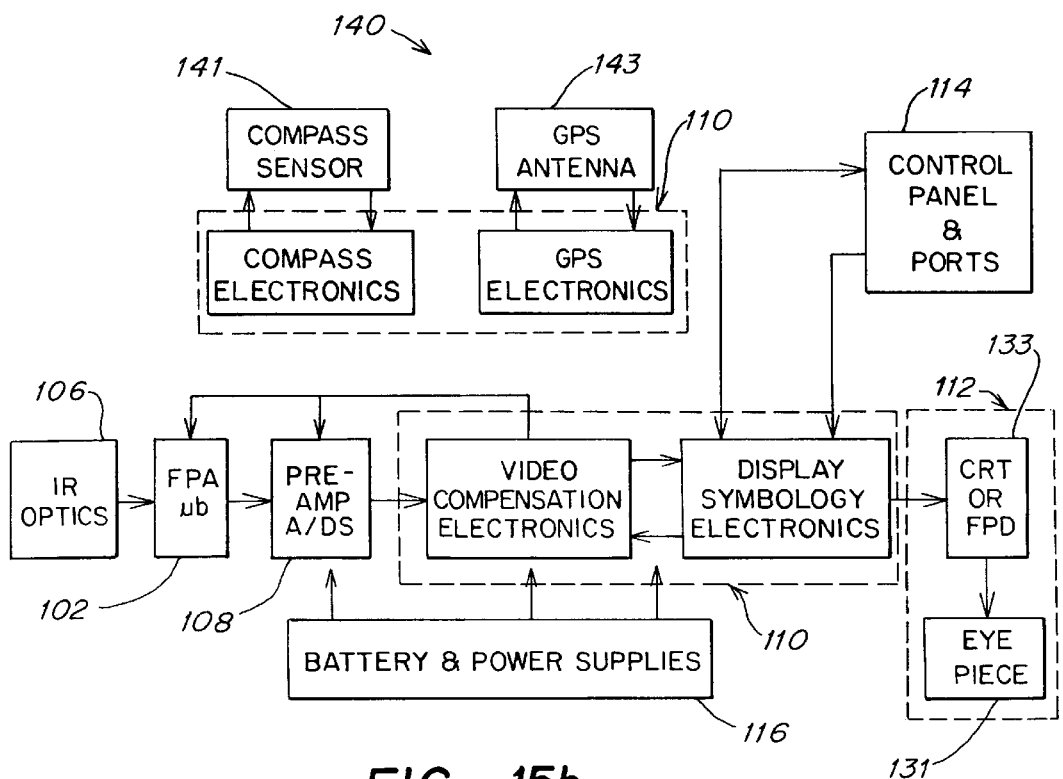

A further example of an imaging system that may use the focal plane array 102 of the present invention is a weapon sight 140, such as is illustrated in FIGS. 15a–15b. FIG. 15a illustrates a top view of the weapon sight according to the present invention, and FIG. 15b illustrates a block diagram of the weapon sight of FIG. 15a. It is to be appreciated that parts similar to the imaging system of FIG. 11 are identified with similar reference numbers, and any description thereof is not repeated. The weapon sight also includes a cover 139 that covers the lens 106, a focus ring 129 for adjusting the focus of the focused signals from the lens 106 onto the focal plane array 102, a compass 141, and a global positioning system (GPS) antenna 143. The display processor 110 includes additional electronics for processing the GPS signal and the compass information. In a preferred embodiment of the weapon sight of FIGS. 15a–15b, the optical lens 106 also includes a filter 122, the supply electronics 116 are batteries, and the display 112 includes the eye piece, 131, a CRT or FPD 133, and a focus adjustment knob 135. The preferred embodiment of the focal plane array is operated in at least one desired IR wavelength band of interest to provide a long-range weapon sight, such as a rifle mount, that can be used to penetrate darkness, to penetrate smoke, can be used in the daytime, and the like. In addition, the weapon sight 140 of the present invention is a self-contained unit having a reduced size, weight, and power consumption, while providing an increased reliability and sensitivity.

Figure 16A:
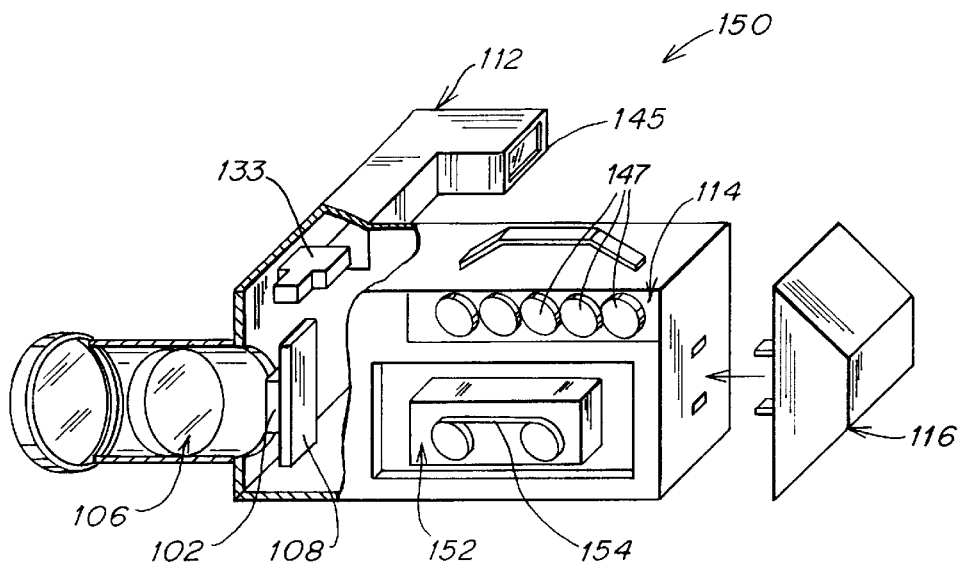
FIGS. 16a and 16b illustrate another embodiment of the imaging system of FIG. 11 which is a camera/recorder (camcorder), in particular
Figure 16B:
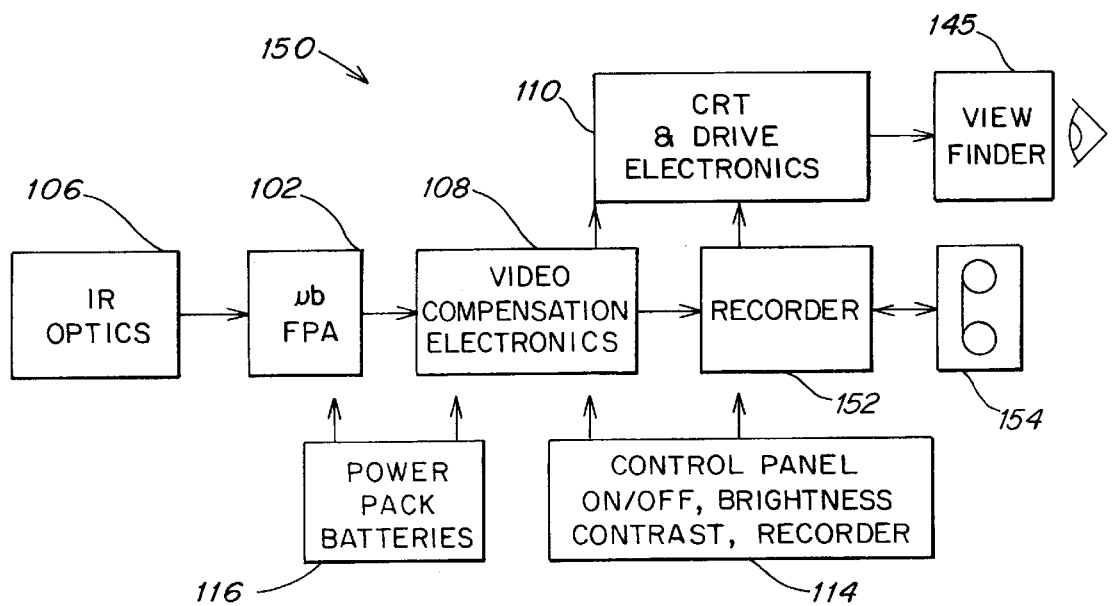

Still another imaging system that may use the focal plane array of the present invention is a miniature camera/recorder (hereinafter a "camcorder") 150 such as is illustrated in FIGS. 16a–16b. FIG. 16a illustrates a cross-sectional view of the camcorder, and FIG. 16b is a block diagram of the camcorder. It is to be appreciated that parts similar to the imaging system of FIG. 11 are identified with similar reference numbers, and any description thereof is not repeated. The camcorder includes a recorder 152 for recording signals on a suitable recording medium 154. It is to be appreciated that the recording medium can be any recording medium known to one of ordinary skill in the art such as a magnetic recording tape of a VHS, 8 mm, or BETA format. In a preferred embodiment of the camcorder, the display 112 includes a view finder 145 as well as a CRT or FPD 133. In addition, in the preferred embodiment the supply electronics 116 is a rechargeable battery pack, and the controller 114 includes control knobs 147 and electronics for rewinding, fast forwarding, and playing back the recording medium. Further, in the preferred embodiment the focal plane array 102 is used in at least one IR wavelength band of interest to provide a long-range camcorder that can be used at night, in the daytime, to penetrate smoke or inclement weather, and the like. In addition, the camcorder of FIGS. 16a, 16b is a self-contained unit having a reduced size, weight and power consumption and also having an increased reliability and sensitivity.

Figure 17A:
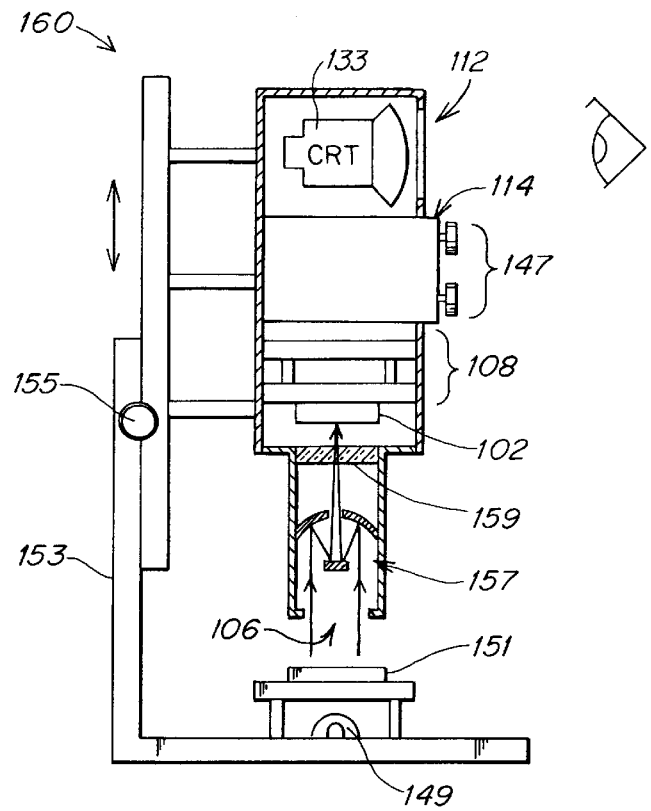
FIGS. 17a and 17b illustrate yet another embodiment of the imaging system of FIG. 11 which is a microscope, in particular
Figure 17B:
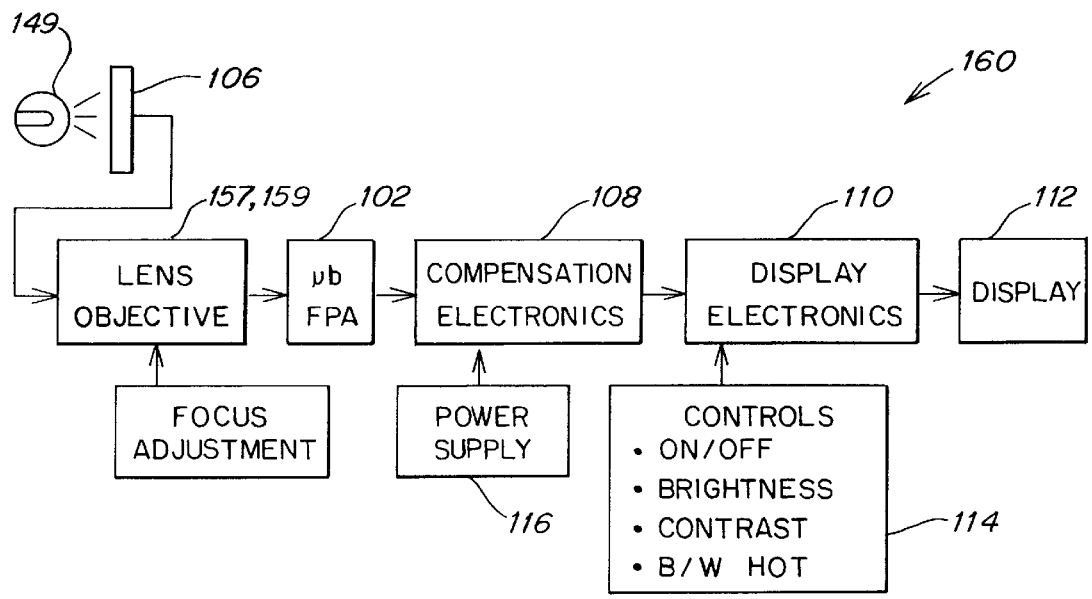

Yet another embodiment of an imaging system that may use the focal plane array of the present invention is a microscope 160 such as is illustrated in FIGS. 17a–17b. FIGS. 17a and 17b illustrate yet another embodiment of the imaging system of FIG. 11 which is a microscope, in particular FIG. 17a is a side elevational view of the microscope and FIG. 17b is a block diagram of the microscope. It is to be appreciated that parts similar to the imaging system of FIG. 11 are identified with similar reference numbers and that any description thereof is not repeated. The microscope includes a microscope base 153 having a position adjuster 155, and a specimen or integrated circuit mask 151 which is backlit by a light source 149, as is known to those of skill in the art. In a preferred embodiment of the microscope of FIGS. 17a–17b, the display 112 includes a CRT or FPD 133, the controller 114 includes manual control knobs 147 and the optics 106 includes a front surface mirror 157. In addition, the preferred embodiment the focal plane array can be used over a plurality of IR wavelength bands of interest, for example, from 3–5 μm, from 8–12 μm, or in the visible range of wavelengths with the aid of filter 159 to provide multi-spectral images with the microscope.

Figure 18A:
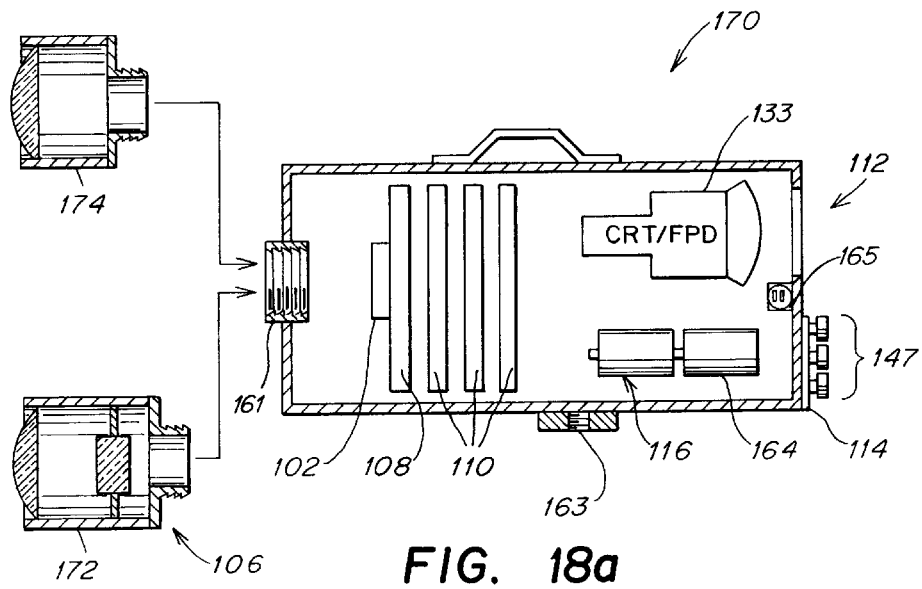
FIGS. 18a and 18b illustrate still another embodiment of the imaging system of FIG. 11 which is a radiometer/spectrometer system, in particular
Figure 18B:
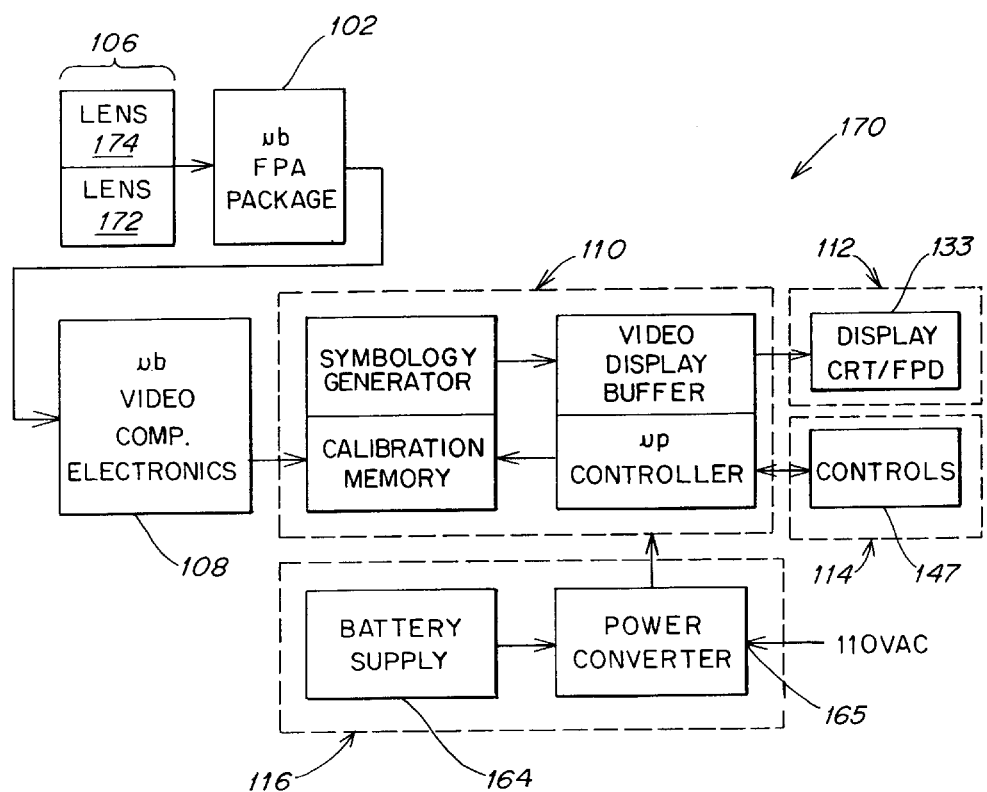

Still, another imaging system that may use the focal plane array of the present invention is the imaging radiometer/spectrometer such as is illustrated in FIGS. 18a–18b. FIG. 18a illustrates a cross-sectional view of the imaging radiometer/spectrometer 170, and FIG. 18b illustrates a block diagram of the imaging radiometer/spectrometer. It is to be appreciated that parts similar to the imaging system of FIG. 11 are identified with similar reference numbers and any description thereof is not repeated. In the imaging radiometer/spectrometer, the lens 106 can be either one of a spectral-splitting lens 172, which is used to provide a spectrometer, and an imaging lens 174 that is used to provide the radiometer. The imaging radiometer is used to measure a temperature of a scene on which the radiometer is focussed, and the spectrometer is used to measure an energy or power emitted by the scene as a function of the wavelength at which the scene is emitting the electromagnetic signal.

The radiometer/spectrometer also includes a lens mount 161 for mounting either of the spectral-splitting lens 172 and the imaging lens 174, and a tripod mount 163 for mounting the radiometer/spectrometer to a tripod. In the preferred embodiment of the radiometer/spectrometer, the display 112 includes a CRT or FPD 133, the controller 114 includes manual control knobs 147, and the supply electronics includes rechargeable batteries 164 as well as a 110 volt AC connector 165. In addition, the focal plane array is used in at least one IR wavelength band of interest to provide a long-range radiometer/spectrometer that can be used at night, in the daytime without washout, to penetrate smoke, and to penetrate inclement weather. Further, the radiometer/spectrometer is a self-contained unit having a reduced size, weight and power consumption while also having an increased reliability and sensitivity.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A dual-band detector, comprising:
   a semiconductor substrate including a detector device that absorbs incident radiation in a first and of wavelengths of incident radiation; and
   a microbridge detector level including a sensing element that absorbs incident radiation in second band of wavelengths of the incident radiation; and
   means for coupling a detected signal, in response to the absorbed incident radiation in the second band of wavelengths, from the sensing element to the semiconductor substrate.

2. The dual-band detector of claim 1, wherein the microbridge detector level is disposed above the detector device and is substantially transmissive to electromagnetic radiation in the first band of wavelengths.

3. The dual-band detector of claim 1, wherein the microbridge detector level is disposed adjacent the detector device.

4. The dual-band detector of claim 3, further comprising a reflective layer disposed on the semiconductor substrate below the microbridge detector level, wherein a distance between the microbridge detector level and the reflective layer is selected so as to enhance absorption of the incident radiation in the second band of wavelengths.

5. The dual-band detector of claim 1, wherein the means for coupling includes downwardly extending leg portions which are a continuation of the microbridge detector level and which support the microbridge detector level above the semiconductor substrate so that a thermal isolation gap exists between the microbridge detector level and the semiconductor substrate; and
   electrically conductive paths included within said downwardly extending leg portions connecting the sensing element to the semiconductor substrate.

6. The dual-band detector of claim 1, wherein the means for coupling comprises etched contacts which vertically extend from the microbridge detector level to the semiconductor substrate and which support the microbridge detector level above the semiconductor substrate so that a thermal isolation gap exists between the microbridge detector level and the semiconductor substrate.

7. The dual-band detector of claims 2 or 3, wherein the sensing element includes a thin film layer of temperature responsive resistive material.

8. The dual-band detector of claim 6, wherein the sensing element includes a layer of absorptive material which has peak absorption characteristics in the second band of wavelengths.

9. The dual-band detector of claim 1, wherein the detector device is a charge coupled device sensor disposed in the semiconductor substrate.

10. The dual-band detector of claim 1, wherein the semiconductor substrate further comprises:
    means for pulsing the sensing element; and
    means for sampling a signal provided by each of the detector device and the sensing element in response to the incident energy in the corresponding first band of wavelengths and the second band of wavelengths.

11. The dual-band detector of claim 1, wherein the semiconductor substrate further comprises an integrated circuit disposed within the semiconductor substrate, that pulses the sensing element and that samples a signal provided by each of the detector device and the sensing element, in response to the incident radiation in each of the respective first band of wavelengths and the second band of wavelengths.

12. The dual-band detector of claim 1, wherein the first band of wavelengths is in a range between 0.4 and 0.8 microns.

13. The dual-band detector of claim 1, wherein the second band of wavelengths is in a range between and 8 and 14 microns.

14. A dual-band detector, comprising:

a semiconductor substrate;

a first microbridge detector disposed above the semiconductor substrate, the first microbridge detector including a first sensing element that absorbs incident radiation in a first range of wavelengths of incident radiation;

a second microbridge detector disposed above the semiconductor substrate, the second microbridge detector including a second sensing element that absorbs incident energy in a second range of wavelengths of the incident radiation;

a first means for coupling a first detected signal from the first sensing element, in response to the incident radiation in the first range of wavelengths, to the semiconductor substrate; and a second means for coupling a second detected signal from the second sensing element, in response to incident radiation in the second range of wavelengths, to the semiconductor substrate.

15. The dual-band detector of claim 14, wherein the second microbridge detector including the second sensing element is substantially transmissive to incident energy outside the second range of wavelengths, wherein the first microbridge detector including the first sensing element is substantially transmissive to incident radiation outside the first range of wavelengths, and wherein the second microbridge detector including the second sensing element is disposed above the first microbridge detector including the first sensing element.

16. The dual-band detector as claimed in claim 15, further comprising a reflective layer disposed on the first microbridge detector level below the second microbridge detector level so that a distance between the second microbridge detector level and the reflective layer enhances absorption of the incident radiation in the second range of wavelengths by the second sensing element.

17. The dual-band detector as claimed in claim 14, wherein the first microbridge detector including the first sensing element is disposed adjacent the second microbridge detector including the second sensing element.

18. The dual-band detector of claim 14, wherein the first sensing element includes a thin film layer of temperature responsive resistive material.

19. The dual-band detector of claim 18, wherein the first sensing element includes a layer of absorptive material which has peak absorption characteristics in the first range of wavelengths.

20. The dual-band detector of claim 18, wherein the second sensing element includes a thin film layer of temperature responsive resistive material.

21. The dual-band detector of claim 20, wherein the second sensing element includes a layer of absorptive material which has peak absorption characteristics in the second range of wavelengths.

22. The dual-band detector of claim 14, further comprising a reflective layer disposed on the semiconductor substrate below the first microbridge detector level and the second microbridge detector level, wherein a first distance between the first microbridge detector level and the reflective layer enhances absorption of the incident radiation in the first range of wavelengths and wherein a second distance between the second microbridge detector level and the reflective layer enhances absorption of the incident radiation in the second range of wavelengths.

23. The dual-band, detector of claim 14, wherein the first range of wavelengths is in a range of 3–5 microns.

24. The dual-band, detector of claim 14, wherein the second range of wavelengths is in a range of 8–14 microns.

25. The dual-band, detector of claim 14, wherein the semiconductor substrate includes means for pulsing each of the first sensing element and the second sensing element.

26. The dual-band detector of claim 25, wherein the semiconductor substrate further includes a respective means for sampling the first detected signal from the first sensing element and for sampling the second detected signal from the second sensing element, in response to the incident energy in the first range of wavelengths and the second range of wavelengths.

27. The dual-band detector of claim 14, wherein the semiconductor substrate includes a readout integrated circuit disposed within the semiconductor substrate that pulses each of the first sensing element and the second sensing element and that samples the first detected signal and the second detected signal, provided by each of the first sensing element and the second sensing element, in response to the incident energy in the corresponding first range of wavelengths and the second range of wavelengths.

28. The dual-band detector of claim 14, wherein the first means for coupling includes first downwardly extending leg portions which are a continuation of the first microbridge detector level and which support the first microbridge detector level above the semiconductor substrate so that a thermal isolation gap exists between the first microbridge detector level and the semiconductor substrate; and first electrically conductive paths included within the first downwardly extending leg portions connecting the first sensing element to the semiconductor substrate.

29. The dual-band detector of claim 28, wherein the second means for coupling includes second downwardly extending leg portions which are a continuation of the second microbridge detector level and which support the second microbridge detector level above the semiconductor substrate so that a thermal isolation gap exists between the second microbridge detector level and the semiconductor substrate; and second electrically conductive paths included within said second downwardly extending leg portions connecting the second sensing element to the semiconductor substrate.

30. The dual-band detector of claim 14, wherein the first means for coupling comprises etched contacts which vertically extend from the first microbridge detector level down to the semiconductor substrate.

31. The dual-band detector of claim 30, wherein the second means for coupling comprises etched contacts which vertically extend from the second microbridge detector level down to the semiconductor substrate.

* * * * *